(12) United States Patent
Tomida

(10) Patent No.: US 11,710,769 B2
(45) Date of Patent: Jul. 25, 2023

(54) SEMICONDUCTOR DEVICE AND MANUFACTURING METHOD THEREFOR

(71) Applicant: SONY SEMICONDUCTOR SOLUTIONS CORPORATION, Kanagawa (JP)

(72) Inventor: Kazuyuki Tomida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 64 days.

(21) Appl. No.: 17/268,843

(22) PCT Filed: Aug. 13, 2019

(86) PCT No.: PCT/JP2019/031826
§ 371 (c)(1),
(2) Date: Feb. 16, 2021

(87) PCT Pub. No.: WO2020/045076
PCT Pub. Date: Mar. 5, 2020

(65) Prior Publication Data
US 2021/0233998 A1    Jul. 29, 2021

(30) Foreign Application Priority Data

Aug. 28, 2018    (JP) ................................ 2018-159090

(51) Int. Cl.
*H01L 29/06*      (2006.01)
*H01L 21/3115*    (2006.01)
*H01L 29/78*      (2006.01)

(52) U.S. Cl.
CPC .... *H01L 29/0673* (2013.01); *H01L 21/31155* (2013.01); *H01L 29/7851* (2013.01)

(58) Field of Classification Search
CPC . H01L 29/785; H01L 29/0673; H01L 29/775; H01L 29/0847; H01L 29/42392
See application file for complete search history.

(56) References Cited

U.S. PATENT DOCUMENTS 4,714,685 A * 12/1987 Schubert .......... H01L 21/02639
                                                  438/300
6,194,278 B1    2/2001 Rengarajan
(Continued)

FOREIGN PATENT DOCUMENTS

JP    H05-048089    2/1993
JP    H06-275824    9/1994
(Continued)

OTHER PUBLICATIONS

International Search Report prepared by the Japan Patent Office dated Aug. 29, 2019, for International Application No. PCT/JP2019/031826.

*Primary Examiner* — Changhyun Yi
(74) *Attorney, Agent, or Firm* — Sheridan Ross P.C.

(57) ABSTRACT

A semiconductor device according to the present disclosure includes a channel portion, a gate electrode disposed opposite the channel portion via a gate insulating film, and source/drain regions disposed at both edges of the channel portion. The source/drain regions include semiconductor layers that have a first conductivity type and that are formed inside recessed portions disposed on a base body. Impurity layers having a second conductivity type different from the first conductivity type are formed between the base body and bottom portions of the semiconductor layers.

20 Claims, 24 Drawing Sheets

(56) References Cited

U.S. PATENT DOCUMENTS

| | | | |
|---|---|---|---|
| 8,642,417 B2* | 2/2014 | Cheng | H01L 29/66492 |
| | | | 438/300 |
| 2006/0138398 A1* | 6/2006 | Shimamune | H01L 29/518 |
| | | | 257/E21.431 |
| 2013/0264639 A1 | 10/2013 | Glass et al. | |
| 2013/0280875 A1 | 10/2013 | Cheng et al. | |

FOREIGN PATENT DOCUMENTS

| | | |
|---|---|---|
| JP | 2003-502862 | 1/2003 |
| JP | 2014-508396 | 4/2014 |
| TW | 463244 B | 11/2001 |
| TW | 201251018 A | 12/2012 |

\* cited by examiner

SEMICONDUCTOR DEVICE AND MANUFACTURING METHOD THEREFOR

CROSS REFERENCE TO RELATED APPLICATIONS

This application is a national stage application under 35 U.S.C. 371 and claims the benefit of PCT Application No. PCT/JP2019/031826 having an international filing date of 13 Aug. 2019, which designated the United States, which PCT application claimed the benefit of Japanese Patent Application No. 2018-159090, filed 28 Aug. 2018, the entire disclosures of each of which are incorporated herein by reference.

TECHNICAL FIELD

The present invention relates to a semiconductor device and a manufacturing method therefor.

BACKGROUND ART

Conventional planar type semiconductor devices (specifically, MOSFETs), schematic partial cross-sectional view thereof being illustrated in FIG. 23, have a significant problem of the occurrence of a reverse bias p-n junction leak current (hereinafter simply referred to as a "leak current"). Note here that FIG. 23 illustrates this leak current using white arrows. Further, in order to reduce the occurrence of such a leak current, impurity profile control based on ion implantation is effective (see, for example, Japanese Patent Laid-open No. 2009-026940). In this case, performing the impurity profile control based on the ion implantation causes crystal defects in source/drain regions and any other portion. Unfortunately, recrystallization for restoring the occurred crystal defects is difficult in, for example, a semiconductor device having a Fin structure, as described later. A power supply voltage $V_{dd}$ for semiconductor devices tends to be lowered, and in the case of such a lowered power supply voltage $V_{dd}$, the occurrence of such a leak current is unlikely to become a significant problem. However, the occurrence of such a leak current is still a significant problem in the case of a high power supply voltage $V_{dd}$, for example, a voltage from 1.5 to 3.3 volts.

Further, a technique for reducing the occurrence of such a leak current is known through, for example, Japanese Patent Laid-open No. 2010-010587. That is, a semiconductor element disclosed in this patent document includes a semiconductor substrate, a projecting region disposed on the semiconductor substrate, a gate insulating film disposed on the projecting region, a channel region located within the projecting region under the gate insulating film, source/drain regions that are disposed at both sides of the projecting region and have extensions at both sides of the channel region, and halo layers that are disposed between the projecting region and the source/drain regions and that have boundaries at portions in contact with the projecting portion. Further, the semiconductor element is manufactured by a manufacturing method for the semiconductor element, the manufacturing method including a step of forming the gate electrode on the semiconductor substrate via the gate insulating film, a step of forming gate sidewalls on side faces of the gate electrode, a step of etching the semiconductor substrate while using the gate electrode as a mask, the gate sidewalls being formed on the gate electrode, a step of epitaxially growing the halo layers on the semiconductor substrate having been etched in the step of etching the semiconductor substrate, and a step of epitaxially growing the source/drain regions on the halo layers. It is described that the configuration that enables the hallo layers to be formed on the etched semiconductor substrate by means of the epitaxial growth method makes it possible to reduce the occurrence of the leak current.

CITATION LIST

Patent Literature

[PTL 1]
Japanese Patent Laid-open No. 2009-026940
[PTL 2]
Japanese Patent Laid-open No. 2010-010587

SUMMARY

Technical Problem

It follows, however, that the halo layers are also formed on boundary regions between the projecting region and the source/drain regions in the semiconductor element obtained on the basis of the manufacturing method for the semiconductor element which is disclosed in Japanese Patent Laid-open No. 2010-010587. Further, the formation of such high concentration impurity layers on the boundary regions causes a problem that the resistance of the channel region increases excessively.

An object of the present disclosure, therefore, is to provide a semiconductor device and a manufacturing method therefor, the semiconductor device being configured and structured to be capable of reducing the occurrence of the leak current and reducing the excessive increase of the resistance of the channel unit.

Solution to Problem

A semiconductor device according to the present disclosure to achieve the above object includes a channel portion, a gate electrode disposed opposite the channel portion via a gate insulating film, and source/drain regions disposed at both edges of the channel portion. Further, the source/drain regions include semiconductor layers that have a first conductivity type and that are formed inside recessed portions disposed on a base body. Impurity layers having a second conductivity type different from the first conductivity type are formed between the base body and bottom portions of the semiconductor layers.

A manufacturing method for a semiconductor device, according to the present disclosure to achieve the above object is a manufacturing method for a semiconductor device including a channel portion, a gate electrode disposed opposite the channel portion via a gate insulating film, and source/drain regions disposed at both edges of the channel portion. Further, the manufacturing method includes the steps of, subsequent to forming the channel portion, forming the gate electrode disposed opposite the channel portion via the gate insulating film, subsequently, partially removing regions of a base body in which the source/drain regions are to be formed, in a thickness direction, to obtain source/drain region formation planned regions, subsequently, forming, in the source/drain region formation planned regions, impurity layers having a second conductivity type, and subsequently, forming, on the impurity layers, the source/drain regions including semiconductor layers having a first conductivity type different from the second conductivity type.

DESCRIPTION OF EMBODIMENTS

Figure 1A:
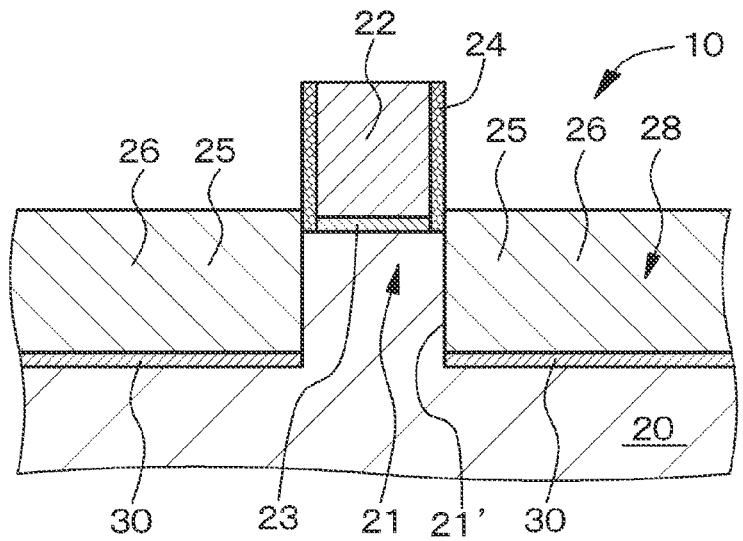
FIG. 1A, FIG. 1B, and FIG. 1C are schematic partial cross-sectional views of a semiconductor device according to an embodiment 1, taken along an arrow A-A, an arrow B-B, and an arrow C-C of FIG. 2.

Hereinafter, the present disclosure will be described with reference to the drawings on the basis of embodiments. Note here that the present disclosure is not limited to the embodiments, and various numerical values and materials in the embodiments are just examples. Here, the description will be made in the following order.

1. General description of semiconductor devices and manufacturing methods therefor according to the present disclosure
2. Embodiment 1 (semiconductor device according to present disclosure and manufacturing method therefor, and semiconductor device having Fin structure)
3. Embodiment 2 (modification example of embodiment 1)
4. Embodiment 3 (another modification example of embodiment 1)
5. Embodiment 4 (still another modification example of embodiment 1, and semiconductor device having nano-wire structure)
6. Others

[General Description of Semiconductor Devices and Manufacturing Methods Therefor According to the Present Disclosure]

In a manufacturing method for a semiconductor device according to the present disclosure, in a state in which a channel portion includes a partial region of a base body and a gate electrode is formed above the channel portion via a gate insulating film, a mode can be employed in which a partial removal of regions of the base body in which source/drain regions are to be formed is performed in a thickness direction, such that a cross-sectional shape of each of side faces of the channel portion that are opposite to source/drain region formation planned regions forms a recessed shape. Such a recessed-shaped cross-sectional shape of each of the side faces of the channel portion can be obtained by performing the partial removal of the base body in the thickness direction on the basis of a dry etching method such as an RIE method, and then, performing a wet etching method.

Alternatively, in a manufacturing method for a semiconductor device according to the present disclosure, in a state in which a channel portion includes a partial region of a base body and a gate electrode is formed above the channel portion via a gate insulating film, a mode can be employed in which, subsequent to performing partial removal of regions of the base body in which source/drain regions are to be formed, in a thickness direction, offset spacers (protection layers) are formed on obtained source/drain region formation planned regions and side faces of the channel portion; subsequently, impurity layers are formed via the offset spacers; and then, the offset spacers are removed. Examples of a material constituting the offset spacers (protection layers) include SiN, SiON, and SiOCN. An example of a method of forming the offset spacers is an atomic layer deposition method (ALD method).

Moreover, in the manufacturing method for the semiconductor device according to the present disclosure that includes the above-described preferred modes, a mode in which the formation of semiconductor layers on the impurity layers is based on an epitaxial growth method can be employed. That is, examples of the method of forming the semiconductor layers include an epitaxial CVD method, but are not limited to such a method, and further include a plasma CVD method and the atomic layer deposition method (ALD method).

Furthermore, in the manufacturing method for the semiconductor device according to the present disclosure that includes the above-described preferred modes, a mode in which the impurity layers are formed in the source/drain region formation planned regions on the basis of an ion implantation method can be employed.

In semiconductor devices according to the present disclosure, or semiconductor devices obtained on the basis of the manufacturing methods for the semiconductor device according to the present disclosure that include the above-described preferred modes (hereinafter, these semiconductor devices may collectively be referred to as "semiconductor device and the like according to the present disclosure" for the sake of convenience), a configuration can be employed in which a channel portion includes a partial region of a base body, a gate electrode is formed above the channel portion via a gate insulating film, and a cross-sectional shape of each of side faces of the channel portion that are opposite to semiconductor layers has a recessed shape. Further, in the semiconductor device and the like according to the present disclosure that includes such a configuration as described above, the configuration can be made such that the channel portion includes a partial region of the base body, the gate electrode is formed above the channel portion via the gate insulating film, and no impurity layer is formed between the partial region of the base body that constitutes the channel portion and the semiconductor layers. Here, when the width of a top portion located at the gate-electrode side of a cross section across the side faces of the channel portion that are opposite to side faces of the semiconductor layers is denoted by $W_{TP}$, the width of a bottom portion located at the base-body side of the cross section across the side faces is denoted by $W_{BT}$, and the width of a thickness-direction central portion of the cross section across the side faces is denoted by $W_{CT}$, the recessed shape means a shape that satisfies the following inequalities.

$$W_{CT} < W_{TP}$$

$$W_{CT} < W_{BT}$$

Alternatively, in the semiconductor device and the like according to the present disclosure, a configuration can be employed in which a channel portion includes a partial region of a base body, a gate electrode is formed above the channel portion via a gate insulating film, second impurity layers are formed between the partial region of the base body that constitutes the channel portion and semiconductor layers, and when the average thickness of the impurity layers is denoted by $T_1$ and the average thickness of the second impurity layers is denoted by $T_2$, the following inequality is satisfied.

$$0 \leq T_2/T_1 \leq 0.5$$

In the semiconductor device and the like according to the present disclosure that include the above-described preferred modes and configurations, a mode can be employed in which an impurity concentration $C_1$ of the impurity layers is higher than an impurity concentration $C_2$ of the semiconductor layers, or preferably, the following inequality is satisfied.

$$0.1 \leq C_2/C_1 \leq 10$$

The semiconductor device and the like according to the present disclosure that include the above-described preferred modes and configurations can be configured into a form having a Fin structure. Alternatively, the semiconductor device and the like according to the present disclosure that include the above-described preferred modes and configurations can be configured into a form having a nano-wire structure or a nano-sheet structure, and in this case, the semiconductor device can be configured into a form in which the gate electrode is formed so as to extend from the top face of the channel portion to the side faces thereof and further to the bottom face thereof. Note that the semiconductor device having such a form, that is, the semiconductor device configured such that the entire periphery of the channel portion is enclosed by the gate electrode is also called a semiconductor device having a GAA (Gate-All-Around) structure. Note here that a planar type semiconductor device (specifically, a MOSFET) can be configured using the semiconductor device and the like according to the present disclosure.

In the semiconductor device and the like according to the present disclosure, the presence of an impurity layer can be detected by using secondary ion mass spectroscopy (SIMS), energy dispersive X-ray spectroscopy (EDS), scanning spreading resistance microscopy (SSRM), scanning capacitance microscopy (SCM), or the like, or by appropriately combining these analysis methods.

The semiconductor device and the like according to the present disclosure can be configured into a mode in which a voltage applied to the gate electrode of the semiconductor device and the like according to the present disclosure is a voltage from 1. 2 to 3.3 volts, which is higher than a normal drive voltage for logical circuit devices, which is 1.0 volts or lower, but the voltage is not limited to such examples.

In the semiconductor device and the like according to the present disclosure that include the above-described preferred forms, modes, and configurations, examples of the base body include a silicon semiconductor substrate, an SOI (Si On Insulator) substrate, a GOI (Ge On Insulator) substrate, and an SGOI (SiGe On Insulator) substrate. The semiconductor layer preferably has a crystalline characteristic, but may be composed of polycrystalline substances or, in some cases, amorphous materials. In the semiconductor device and the like according to the present disclosure, in the case where the first conductivity type is an n-type, the second conductivity type is a p-type, whereas, in the case where the first conductivity type is the p-type, the second conductivity type is the n-type.

In the following description, the channel portion, the gate insulating film, and the gate electrode may collectively be referred to as a "channel structure portion."

In the semiconductor device and the like according to the present disclosure that have the nano-wire structure or the nano-sheet structure, the periphery of a channel portion is at least partially covered by a gate insulating film along the periphery direction, and a gate electrode is formed on the gate insulating film. For the channel structure portion, it is sufficient just to dispose one or more channel structure portions. In the case where a plurality of channel structure portions is disposed, it is sufficient just to dispose the channel structure portions such that the channel structure portions are located apart from each other in the thickness direction and/or a width direction (a direction perpendicular to the thickness direction) of the semiconductor device. That is, the gate insulating film and the gate electrode are formed between a channel portion and an adjacent channel portion, and the gate insulating film and the gate electrode are embedded between the channel portion and the adjacent channel portion. In the nano-structure, both edges of each of wire-shaped channel portions, each having a diameter of, for example, 5 to 10 nm and being made of, for example, Si, SiGe, or the like, are supported by, for example, source/drain regions. Further, in the nano-sheet structure, both edges of each of channel portions, each having a width of, for example, 10 to 50 nm and a thickness of 5 to 10 nm, being made of, for example, Si, SiGe, or the like, and having a substantially rectangular cross-sectional shape, are supported by, for example, the source/drain regions. Which of the nano-structure and the nano-sheet structure is employed depends on the thickness and width of a material constituting the channel portion.

In the case where the semiconductor device and the like according to the present disclosure have the nano-wire structure or the nano-sheet structure, examples of a material constituting the channel portion in the nano-wire structure or the nano-sheet structure include Si, SiGe, Ge, and InGaAs. A mode can be employed in which the channel portion in a semiconductor device of the n-channel type is made of Si and the channel portion in a semiconductor device of the p-channel type is made of SiGe, Ge, or InGaAs. Note, however, that, without being limited to this mode, a mode [A] can be employed in which the channel portion in the semiconductor device of the n-channel type is made of silicon-germanium (SiGe) and the channel portion in the semiconductor device of the p-channel type is made of silicon (Si), germanium (Ge), or InGaAs; a mode [B] can be employed in which the channel portion in the semiconductor device of the re-channel type is made of germanium (Ge) and the channel portion in the semiconductor device of the p-channel type is made of silicon (Si), silicon-germanium (SiGe), or InGaAs; and a mode (C) can be employed in which the channel portion in the semiconductor device of the n-channel type is made of InGaAs and the channel portion in the semiconductor device of the p-channel type is made of silicon (Si), silicon-germanium (SiGe), or germanium (Ge).

Further, in the case where the semiconductor device and the like according to the present disclosure have the nano-wire structure or the nano-sheet structure, whether the semiconductor device is of the n-channel type or the p-channel type is exclusively determined by a value of a work function associated with a material constituting the gate electrode. In the case of configuring the channel portion using Si, examples of a material constituting the gate electrode and causing the semiconductor device to be of the n-channel type include TiN, TaN, Al, TiAl, and W. On the contrary, in the case of configuring the channel portion using SiGe, examples of a material constituting the gate electrode and causing the semiconductor device to be of the p-channel type include TiN and W. Further, examples of a material constituting the gate insulating film include SiON and SiO$_2$, and further, include high dielectric constant materials (what are called High-k materials), such as HfO$_2$, HfAlON, and Y$_2$O$_3$.

The semiconductor device and the like according to the present disclosure that have the Fin structure include a channel portion that is formed in a base body and has a rectangular cross-sectional shape, source/drain regions disposed at both edges of the channel portion region, a gate insulating film formed on at least the top face of the channel portion, and a gate electrode formed on the gate insulating film. It is sufficient just to form the gate insulating film on at least the top face of the channel portion, and examples of such a form of the gate insulating film include a form in which the gate insulating film is formed on the top face of the channel portion and a form in which the gate insulating film is formed on the top face and side faces of the channel portion. In the semiconductor device and the like according to the present disclosure that have the Fin structure, the width of the channel portion may be the same as the width of each of the source/drain regions, or the width of each of the source/drain regions may be larger than the width of the channel portion.

The mode of arranging the semiconductor device and the like according to the present disclosure depends on required specifications of the semiconductor device, and thus cannot be determined in a generalized manner. Examples of the mode of arranging the semiconductor device and the like according to the present disclosure include a mode in which transistors for transmitting/receiving signals and the like to/from the outside are configured using the semiconductor device and the like according to the present disclosure; a mode in which the semiconductor device and the like according to the present disclosure control imaging elements (light receiving elements) in an imaging device using transistors and the like and configuring an analog/digital converter; and a mode in which the semiconductor device and the like according to the present disclosure control light receiving elements in an imaging device. Note, however, that the mode of arranging the semiconductor device and the like according to the present disclosure is not limited to the above modes.

Embodiment 1

Figure 1B:
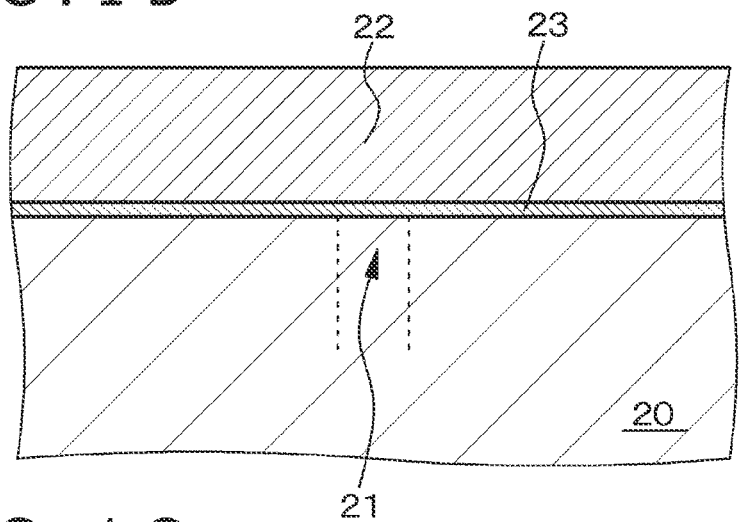
Figure 1C:
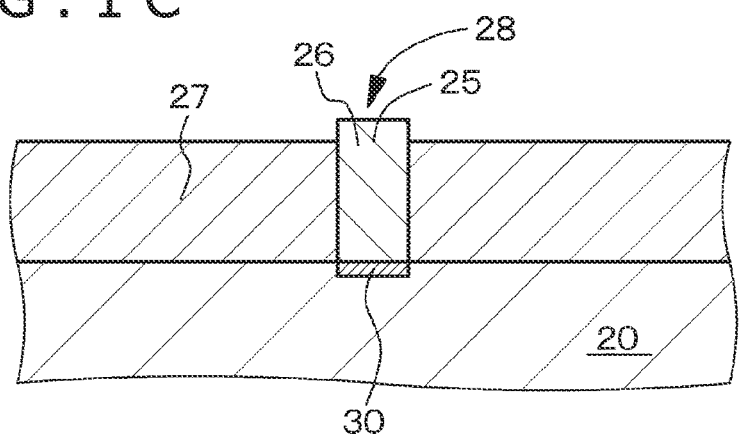
Figure 2:
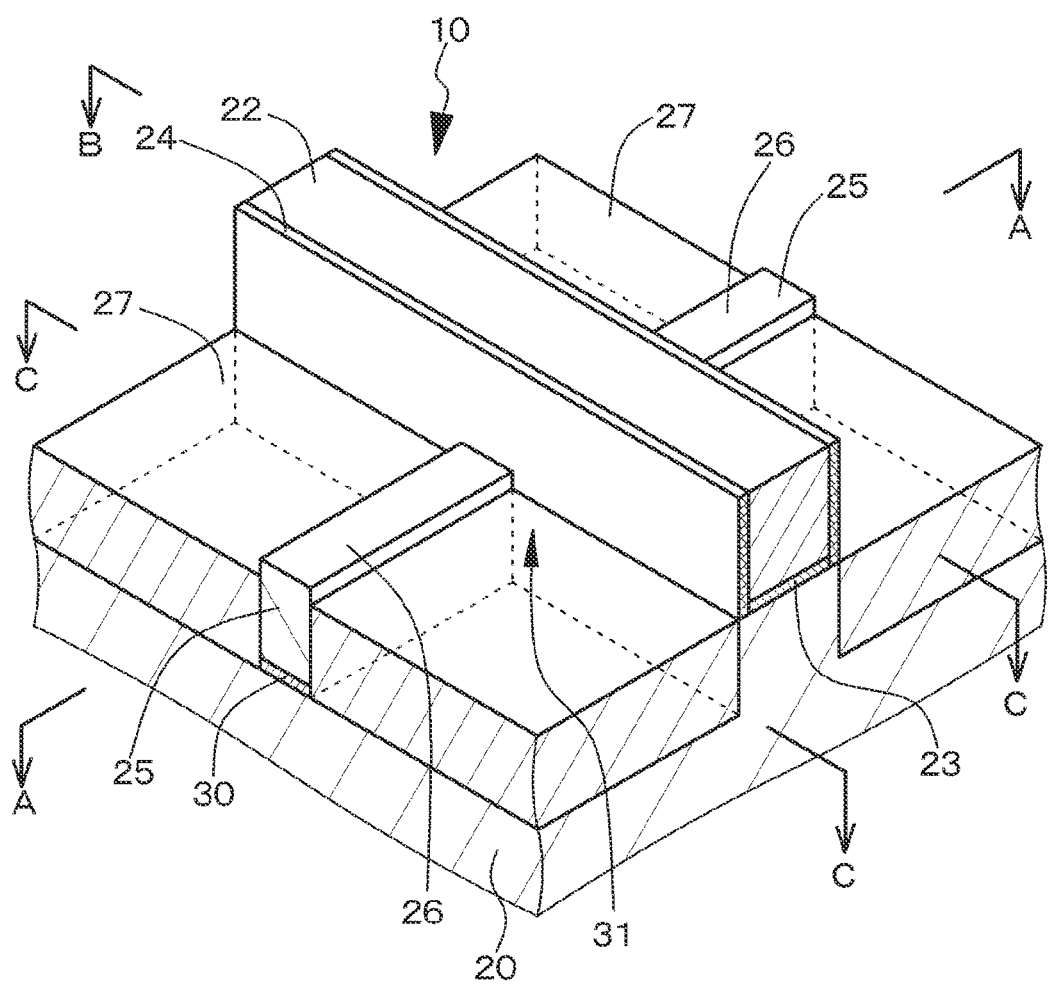
FIG. 2 is a schematic partial perspective view of the semiconductor device according to the embodiment 1.
Figure 3A:
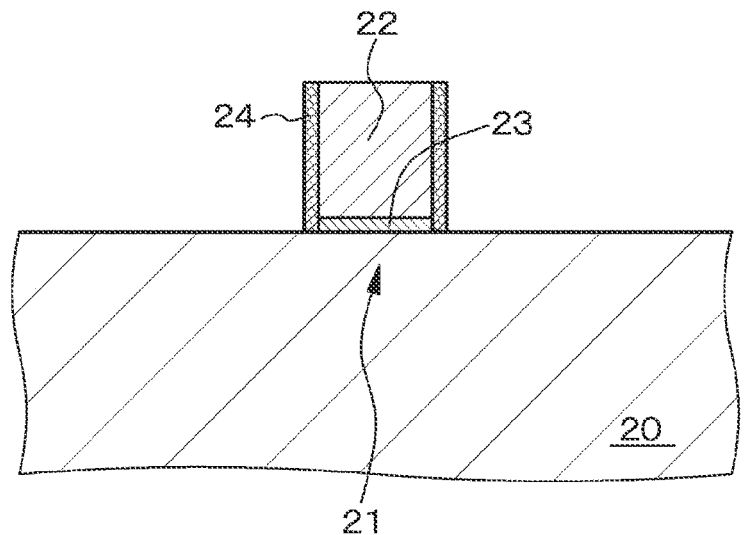
FIG. 3A, FIG. 3B, and FIG. 3C are schematic partial edge views of a base body and other elements, taken in a way similar to that along the arrow A-A, the arrow B-B, and the arrow C-C of FIG. 2, for the purpose of describing a manufacturing method for the semiconductor device according to the embodiment 1.
Figure 3B:
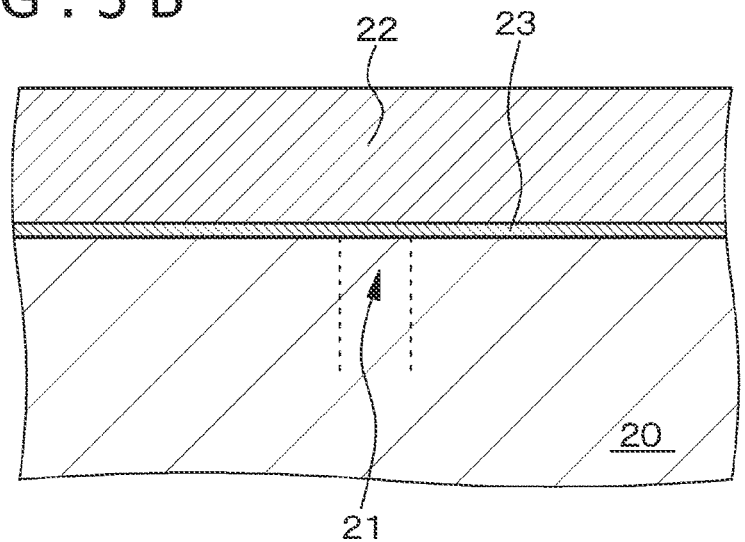
Figure 3C:
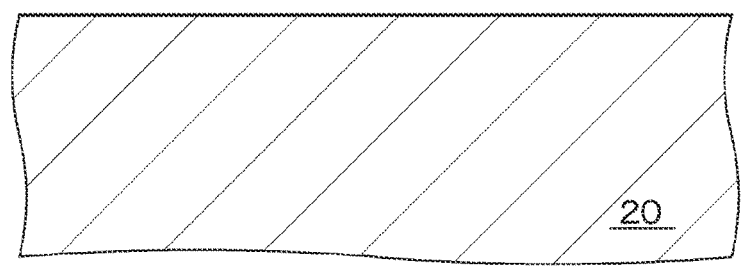

This embodiment 1 relates to a semiconductor device and a manufacturing method therefor according to the present disclosure. FIGS. 1A, 1B, and 1C illustrate schematic partial cross-sectional views of a semiconductor device according to the embodiment 1, taken along arrows A-A, B-B, and C-C of FIG. 2, and FIG. 2 illustrates a schematic partial perspective view of the semiconductor device according to the embodiment 1.

A semiconductor device 10 according to the embodiment 1 and embodiments 2 and 3 described later includes a channel portion 21, a gate electrode 22 disposed opposite the channel portion 21 via a gate insulating film 23, and source/drain regions 25 disposed at both edges of the channel portion 21. The source/drain regions 25 include semiconductor layers 26 that have a first conductivity type (specifically, for example, n$^+$) and that are formed inside recessed portions 28 disposed on a base body 20. Impurity layers (high-concentration impurity layers) 30 having a second conductivity type (specifically, for example, p$^{++}$) different from the first conductivity type are formed between bottom portions of the semiconductor layers 26 and the base body 20.

Here, in the semiconductor device 10 according to the present embodiment 1, in a state in which the channel portion 21 includes a partial region of the base body 20 and the gate electrode 22 is formed above the channel portion 21 via the gate insulating film 23, second impurity layers 31 are formed between the partial region of the base body 20 that constitutes the channel portion 21 and the semiconductor layers 26, and when the average thickness of the impurity layers 30 is denoted by $T_1$ and the average thickness of the second impurity layers 31 is denoted by $T_2$, the following inequality is satisfied.

$$0 < T_2/T_1 \le 0.5$$

Specifically, the following example formula is satisfied.

$$T_2/T_1 = 0.05$$

Note that, in the case where each of the second impurity layers 31 has a thickness of this degree, a situation in which the resistance of the channel region excessively increases almost never occurs. The description of the second impurity layers 31 will be made later.

Further, in the semiconductor device 10 according to the embodiment 1 and the embodiments 2 and 3 and a semiconductor device 11 according to an embodiment 4, an impurity concentration $C_1$ of the impurity layers 30 is higher than an impurity concentration $C_2$ of the semiconductor layers 26. Alternatively, the following inequality is satisfied.

$$0.1 \le C_2/C_1 \le 10$$

Specifically, the following example formula is satisfied.

$$C_2/C_1 = 0.2$$

Moreover, the semiconductor device 10 according to the embodiment 1 and the embodiments 2 and 3 has the Fin structure. Specifically, the semiconductor device 10 according to the embodiment 1 and the embodiments 2 and 3 that has the Fin structure includes the channel portion 21 that has a rectangular cross-sectional shape and that is formed in the base body 20, the source/drain regions 25 disposed at both edges of the channel portion 21, the gate insulating film 23 formed on at least the top face of the channel portion 21, and the gate electrode 22 formed on the gate insulating film 23. The base body 20 is made of a silicon semiconductor substrate. The width of the channel portion 21 and the width of each of the source/drain regions 25 may be equal to each other, or the width of each of the source/drain regions 25 may be larger than the width of the channel portion 21.

Hereinafter, a manufacturing method for the semiconductor device according to the present embodiment 1 will be described with reference to FIGS. 3A, 3B, 3C, 4A, 4B, 4C, 5A, 5B, 5C, 6A, 6B, and 6C, each being a schematic partial edge view or a schematic partial cross-sectional view of the base body and other elements, taken in a way similar to a corresponding one of the ways along the arrows A-A, B-B, and C-C of FIG. 2.

[Step-100]

First, subsequent to forming the channel portion 21, the gate electrode 22 opposite the channel portion 21 via the gate insulating film 23 is formed. Specifically, subsequent to forming unillustrated element separation regions by using a known method, the channel portion 21 is formed by performing ion implantation as needed into a portion of the base body 20 in which the channel portion 21 is to be formed. Next, the gate insulating film 23 is formed on the surface of the base body 20 by thermally oxidizing the surface of the base body 20, and then, the gate electrode 22 is formed on the gate insulating film 23 by using a known method. Moreover, gate sidewalls 24 are formed on the sidewalls of the gate electrode 22 by using a known method. In this way, a structure illustrated in FIGS. 3A, 3B, and 3C can be obtained.

[Step-110]

Figure 4A:
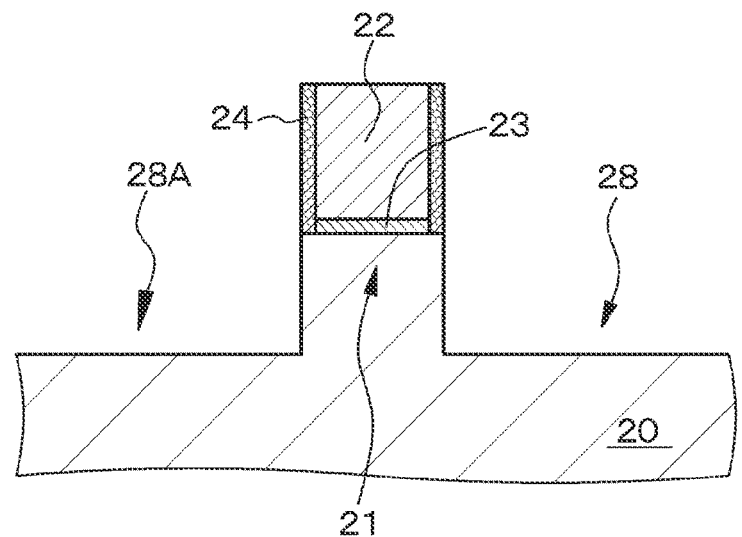
FIG. 4A, FIG. 4B, and FIG. 4C are schematic partial edge views of the base body and other elements, taken in a way similar to that along the arrow A-A, the arrow B-B, and the arrow C-C of FIG. 2, for the purpose of describing the manufacturing method for the semiconductor device according to the embodiment 1, following the description using the FIG. 3A, FIG. 3B, and FIG. 3C.
Figure 4B:
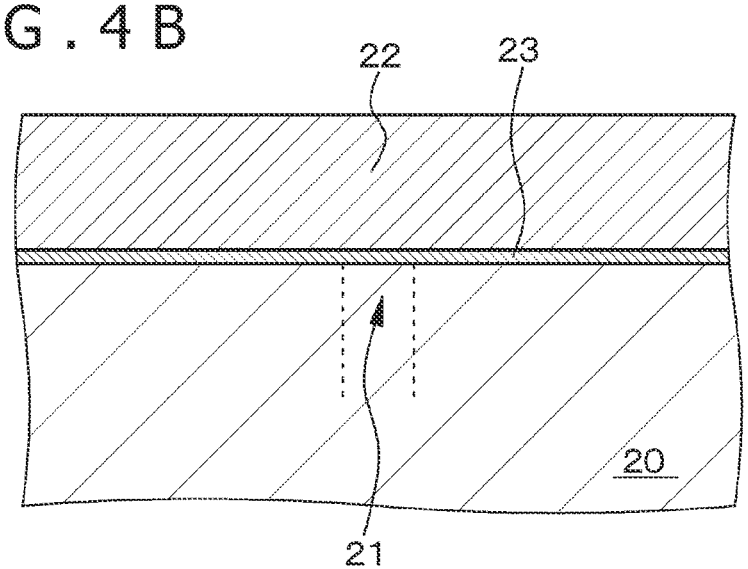
Figure 4C:
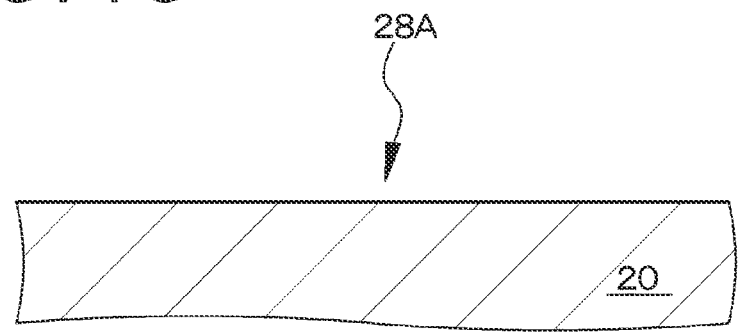

Next, source/drain region formation planned regions 28A are obtained by partially removing regions of the base body 20 in which the source/drain regions 25 are to be formed, in the thickness direction. Specifically, subsequent to forming unillustrated etching masks on desired regions, the recessed portions 28 are formed in the base body 20 by partially removing regions of the base body 20 in which the source/drain regions 25 are to be formed, in the thickness direction, with use of a known method, and then, the etching masks are removed. In this way, the source/drain region formation planned regions 28A can be obtained, as illustrated in FIGS. 4A, 4B, and 4C.

[Step-120]

Thereafter, the impurity layers 30 having the second conductivity type are formed in the source/drain region formation planned regions 28A (bottom portions of the recessed portions 28). Specifically, insulating layers 27 are formed by using a known method, on the entire region of the base body 20 except the source/drain region formation planned regions 28A. As a result, the recessed portions 28 are formed in the insulating layers 27, and the source/drain region formation planned regions 28A are exposed on the bottom portions of the recessed portions 28. In this way, a structure illustrated in FIGS. 5A, 5B, and 5C can be obtained. Next, subsequent to covering desired regions by using ion-implantation masks, the impurity layers 30 having the second conductivity type (for example, $p^{++}$) are formed in the bottom portions of the recessed portions 28, which correspond to the source/drain region formation planned regions 28A, on the basis of an ion implantation method. Thereafter, an activation annealing treatment is performed, and then, the ion-implantation masks are removed. In this way, a structure illustrated in FIGS. 6A, 6B, and 6C can be obtained.

[Step-130]

Next, the source/drain regions 25 including the semiconductor layers 26 having the first conductivity type (for example, $n^+$) different from the second conductivity type are formed on the impurity layers 30. The formation of the semiconductor layers 26 on the impurity layers 30 is based on an epitaxial growth method. Specifically, the semiconductor layers 26 made of silicon containing impurities having the first conductivity type are caused to grow from the impurity layers 30 made of silicon, on the basis of the epitaxial growth method. In this way, the structure illustrated in FIGS. 1A, 1B, and 1C can be obtained. Further, in addition to the above, it is sufficient just to, subsequent to forming inter-layer insulating layers on the entire face, form openings in inter-layer insulating layers located above the gate electrode 22 and the source/drain regions 25, and form connection holes and wirings from inside the openings up to the inter-layer insulating layers.

Figure 24A:
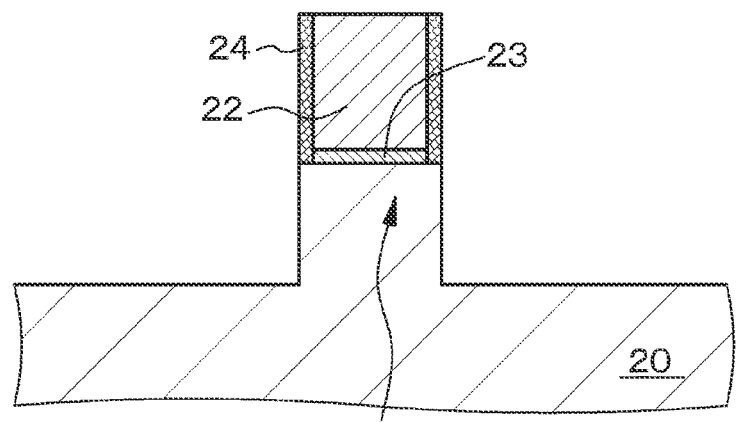
FIG. 24A and FIG. 24B are respectively a schematic partial edge view of a base body and other elements, taken in a way similar to that along the arrow A-A of FIG. 2, and a schematic partial edge view of the base body and other elements, taken in a way similar to that along the arrow B-B of FIG. 2, for the purpose of describing a problem in a conventional semiconductor device having a Fin structure.
Figure 24B:
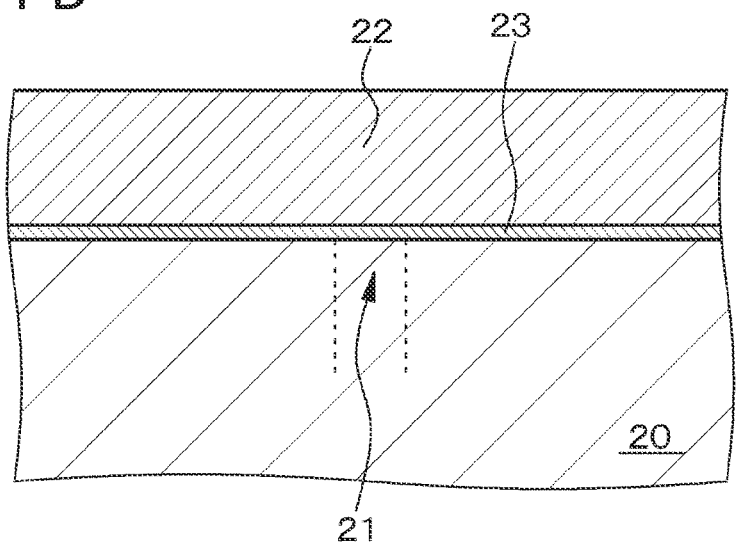
Figure 24C:
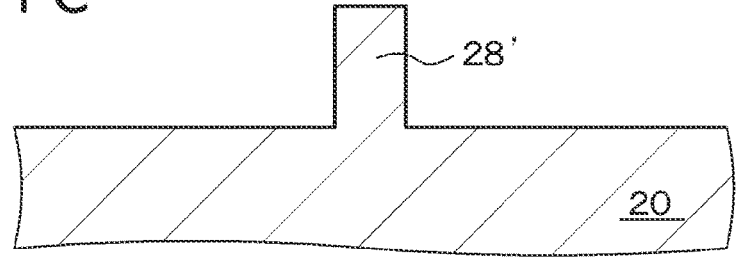
FIG. 24C and FIG. 24D are schematic partial edge views of the base body and other elements, taken in a way similar to that along the arrow C-C of FIG. 2, for the purpose of describing the problem in the conventional semiconductor device having the Fin structure.
Figure 24D:
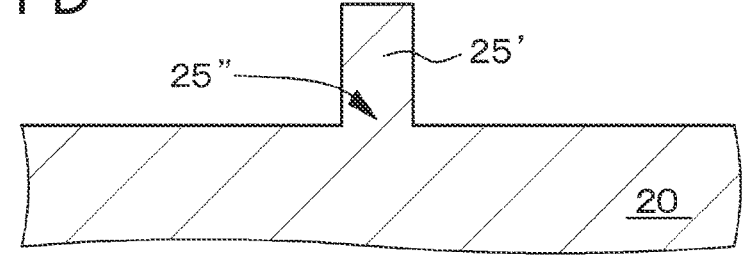

In a conventional semiconductor device having the Fin structure, in [step-110] described above, source/drain region formation planned regions 28A' including the base body 20 are obtained by partially removing predetermined regions of the base body 20 in the thickness direction. In this way, a structure illustrated in FIGS. 24A, 24B, and 24C can be obtained. Thereafter, source/drain regions 25' are formed by performing ion implantation into the source/drain region formation planned regions 28A' including the base body 20 (see FIG. 24D). In this ion implantation, crystal defects occur in portions of the base body 20 that constitute the source/drain regions 25'. Further, in the case where, in order to restore the occurred crystal defects, recrystallization is attempted by performing an annealing treatment, crystal defects in bottom portions 25" of the source/drain regions 25' are restored by the recrystallization, but the recrystallization of portions of the source/drain regions 25' that are located above the bottom portions 25" are less likely to proceed, and thus, the recrystallization of the entire portion of the source/drain regions 25' is difficult.

In the semiconductor device according to the present embodiment 1, since the source/drain regions include the semiconductor layers that have the first conductivity type and that are formed inside the recessed portions disposed on the base body and the impurity layers having the second conductivity type different from the first conductivity type are formed between the base body and the bottom portions of the semiconductor layers, that is, since the impurity layers are formed between the base body and the bottom portions of the semiconductor layers constituting the source/drain regions, and further, since, in the manufacturing method for the semiconductor device according to the present embodiment 1, the impurity layers having the second conductivity type are formed in the source/drain region formation planned regions, and then, the source/drain regions including the semiconductor layers having the first conductivity type different from the second conductivity type are formed on the impurity layers, reduction of the occurrence of the leak current can be achieved. In addition to the above, in the manufacturing method for the semiconductor device according to the present embodiment 1, since the impurity layers having the second conductivity type are formed in the source/drain region formation planned regions by means of the ion implantation method, high-concentration impurity layers are unlikely to be formed on boundary regions between the channel portion and the source/drain regions, and thus, the occurrence of such a problem that the resistance of the channel region excessively increases can be suppressed.

Embodiment 2

Figure 22A:
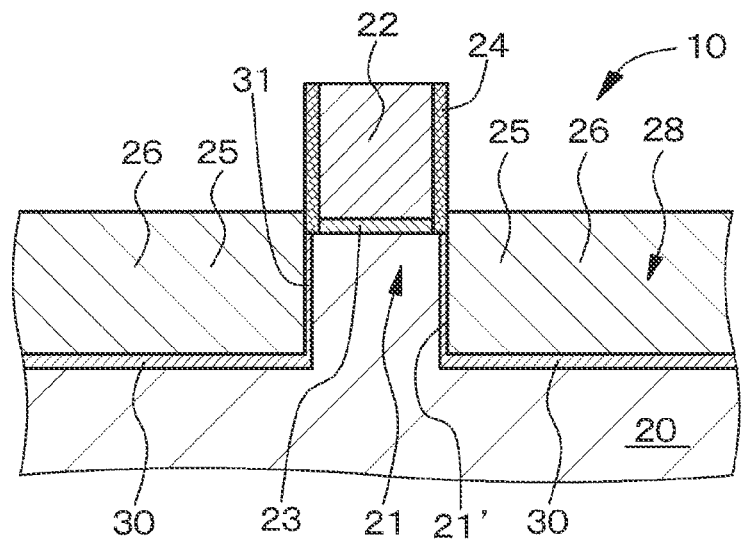
FIG. 22A and FIG. 22B are respectively a schematic partial cross-sectional view of another example of the semiconductor device according to the embodiment 1, taken in a way similar to that along the arrow A-A of FIG. 2, and a schematic partial cross-sectional view of another example of the semiconductor device according to the embodiment 2, taken in a way similar to that along the arrow A-A of FIG. 2.

This embodiment 2 is a modification of the embodiment 1. In the semiconductor device according to the embodiment 1, the high-concentration impurity layers are unlikely to be formed on boundary regions 21' between the channel portion 21 and the source/drain regions 25. However, there may occur a situation in which the high-concentration impurity layers (the second impurity layers 31) are, albeit only slightly, formed on the boundary regions 21' between the channel portion 21 and the source/drain regions 25 although the occurrence depends on conditions for forming the impurity layers 30 and any other condition (see FIG. 22A, which is a schematic partial cross-sectional view of another example of the semiconductor device according to the embodiment 1, taken in a way similar to that along the arrow A-A of FIG. 2). In the embodiment 2, the cross-sectional shape of each of side faces 21A of the channel portion 21 that are opposite to side faces of the semiconductor layers 26 is formed so as to have a recessed shape, and this configuration more reliably reduces the formation of the high-concentration impurity layers on the boundary regions 21' between the channel portion 21 and the source/drain regions 25. This recessed-shaped cross section is a shape that is sometimes employed to make the volume of the source/drain regions larger.

Figure 7A:
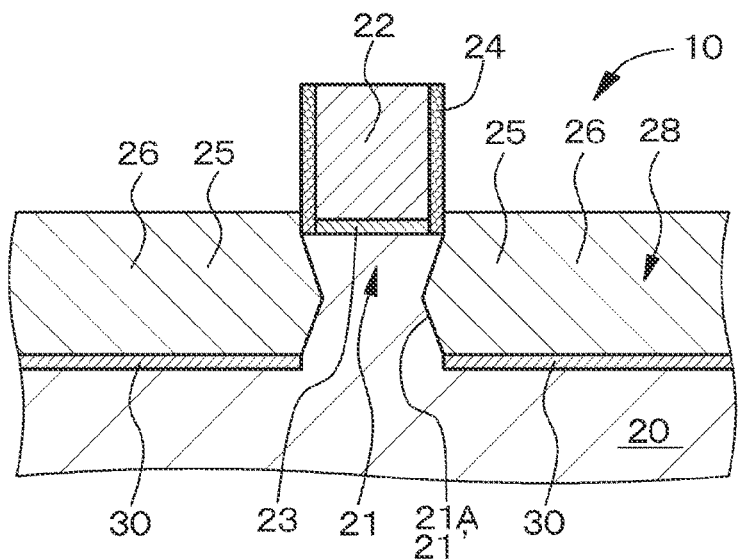
FIG. 7A, FIG. 7B, and FIG. 7C are schematic partial cross-sectional views of a semiconductor device according to an embodiment 2, taken in a way similar to that along the arrow A-A, the arrow B-B, and the arrow C-C of FIG. 2.
Figure 7B:
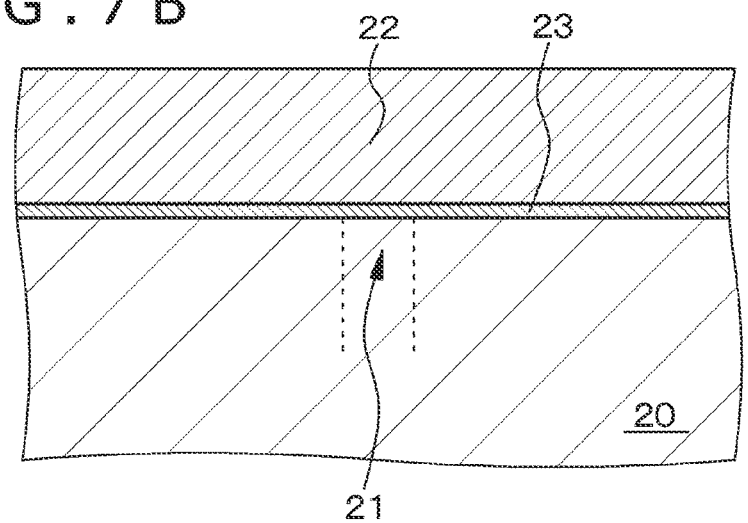
Figure 7C:
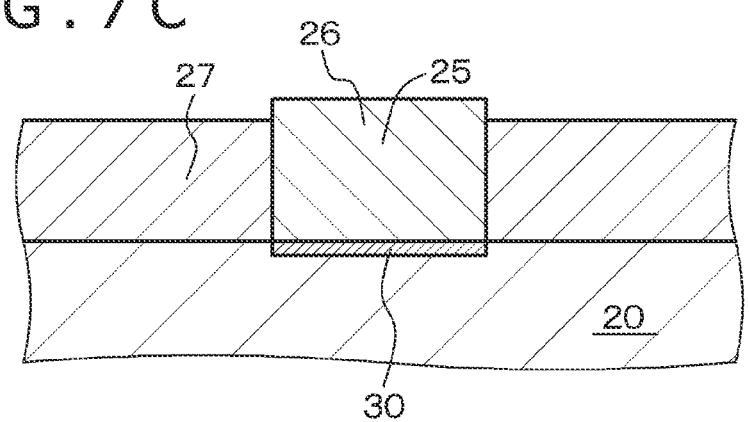

Specifically, as illustrated in FIGS. 7A, 7B, and 7C, which are schematic partial cross-sectional views of a semiconductor device according to the embodiment 2, taken in a way similar to that along the arrows A-A, B-B, and C-C of FIG. 2, in the semiconductor device according to the embodiment 2, the cross-sectional shape of each of the side faces 21A of the channel portion 21 that are opposite to the side faces of the semiconductor layers 26 has the recessed shape. In the semiconductor device according to the embodiment 2, just like the semiconductor device according to the embodiment 1, the channel portion 21 includes a partial region of the base body 20, and the gate electrode 22 is disposed above the channel portion 21 via the gate insulating film 23. Further, in the semiconductor device according to the present embodiment 2, in addition to the above, the impurity layers (the second impurity layers 31) are not formed between the partial region of the base body 20 that constitutes the channel portion 21 and the semiconductor layers 26. Here, for the recessed shape, the following inequalities are satisfied.

$$W_{CT} < W_{TP}$$

$$W_{CT} < W_{BT}$$

Figure 8A:
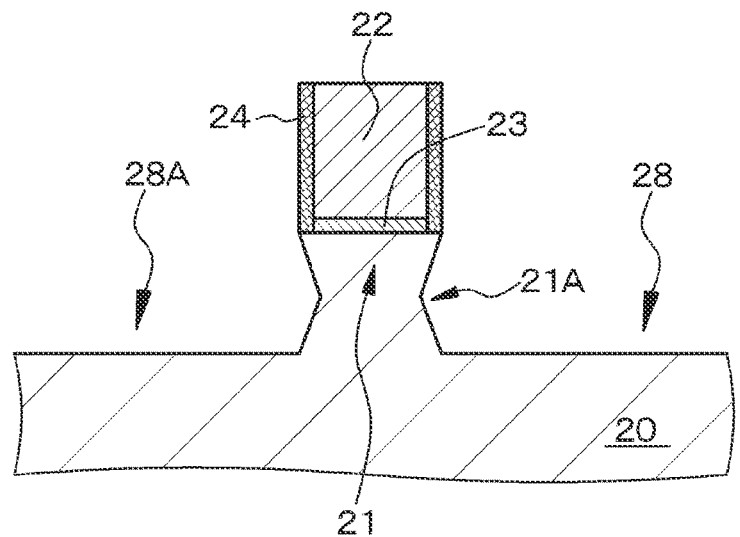
FIG. 8A, FIG. 8B, and FIG. 8C are schematic partial edge views of a base body and other elements, taken in a way similar to that along the arrow A-A, the arrow B-B, and the arrow C-C of FIG. 2, for the purpose of describing a manufacturing method for the semiconductor device according to the embodiment 2.
Figure 8B:
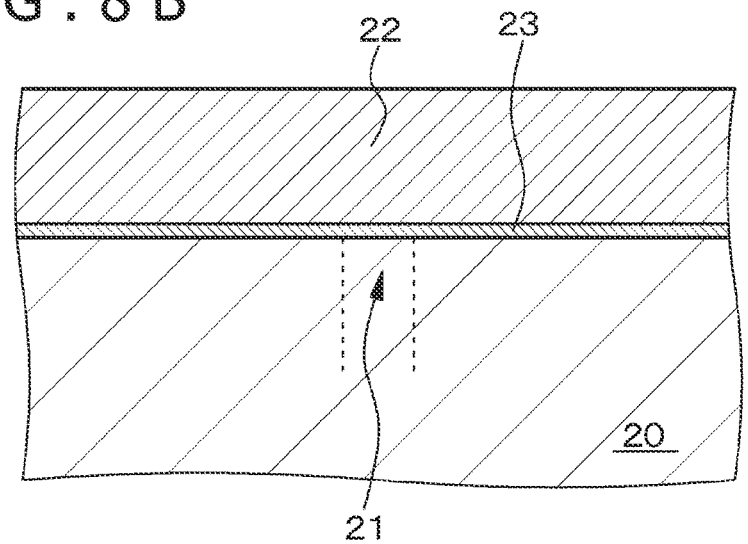
Figure 8C:
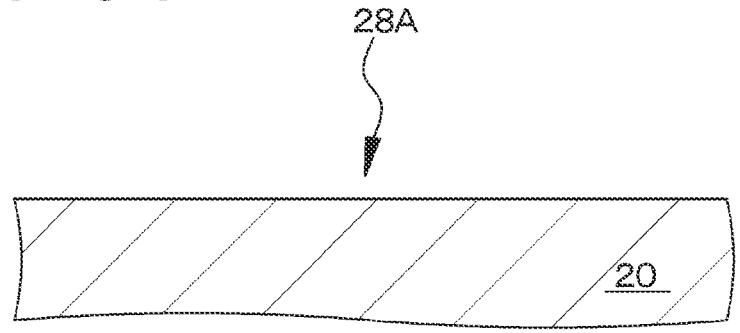

For such a cross-sectional shape (the recessed shape) of each of the side faces of the channel portion 21 that are opposite to the side faces of the semiconductor layers 26, it is sufficient just to, in a step similar to [step-110] of the embodiment 1 after the execution of a step similar to [step-100] of the embodiment 1, partially remove regions of the base body 20 in which the source/drain regions 25 are to be formed, in the thickness direction, such that the cross-sectional shape of each of the side faces 21A of the channel portion 21 that are opposite to side faces of the source/drain region formation planned regions 28A forms the recessed shape. More specifically, it is sufficient just to cause the partial removal of the base body 20 to be performed in the thickness direction, on the basis of, firstly, a dry etching method such as an RIE method, and then, a wet etching method. In this way, as illustrated in FIGS. 8A, 8B, and 8C, the source/drain region formation planned regions 28A can be obtained. Here, setting the face orientation of the main face of the base body 20 made of the silicon semiconductor substrate to, for example, [110] enables the cross-sectional shape of each of the side faces 21A of the channel portion 21 to be formed into the recessed shape by means of etching. In addition, the cross-sectional shape of the channel portion 21 which is obtained by the etching changes according to the face orientation of the substrate 20 and a direction in which the channel portion 21 extends.

Figure 9A:
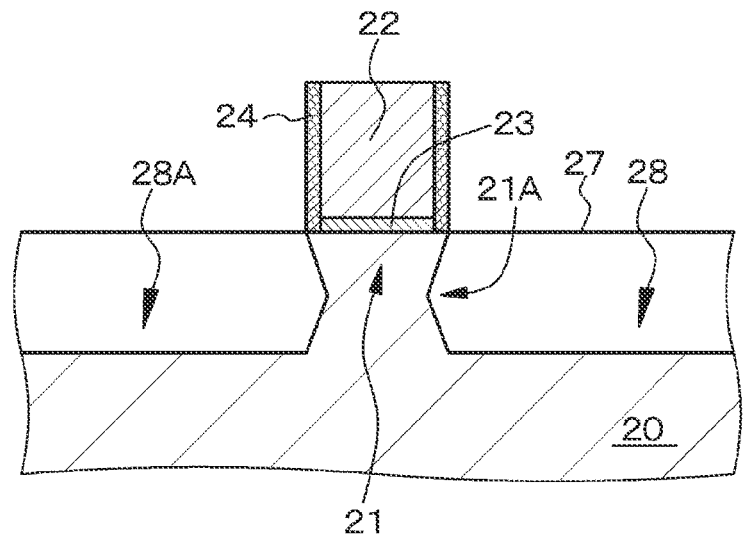
FIG. 9A, FIG. 9B, and FIG. 9C are a schematic partial cross-sectional view, a schematic partial edge view, and a schematic partial edge view of the base body and other elements, taken in a way similar to that along the arrow A-A, the arrow B-B, and the arrow C-C of FIG. 2, for the purpose of describing the manufacturing method for the semiconductor device according to the embodiment 2, following the description using FIG. 8A, FIG. 8B, and FIG. 8C.
Figure 9B:
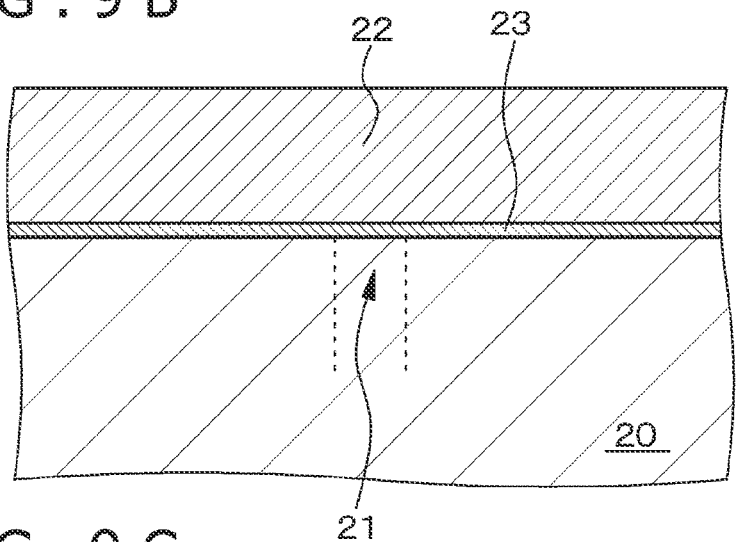
Figure 9C:
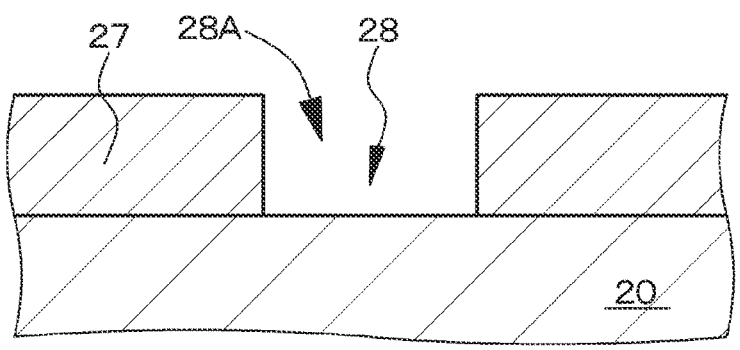
Figure 10A:
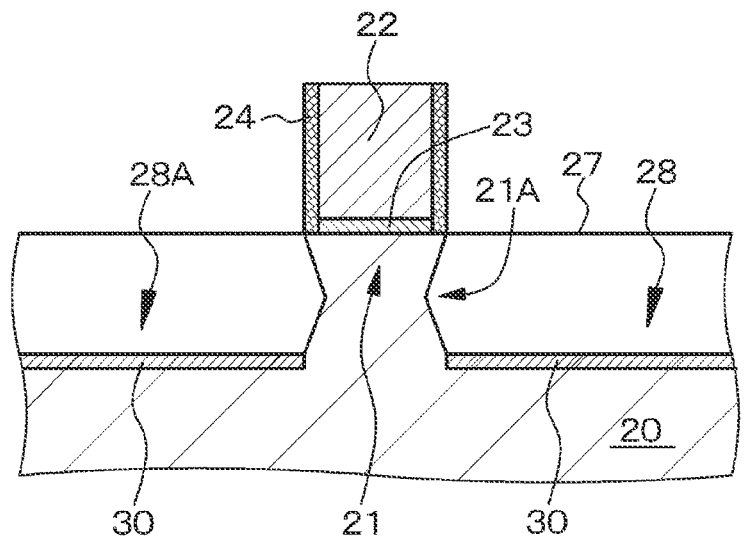
FIG. 10A, FIG. 10B, and FIG. 10C are a schematic partial cross-sectional view, a schematic partial edge view, and a schematic partial edge view of the base body and other elements, taken in a way similar to that along the arrow A-A, the arrow B-B, and the arrow C-C of FIG. 2, for the purpose of describing the manufacturing method for the semiconductor device according to the embodiment 2, following the description using FIG. 9A, FIG. 9B, and FIG. 9C.
Figure 10B:
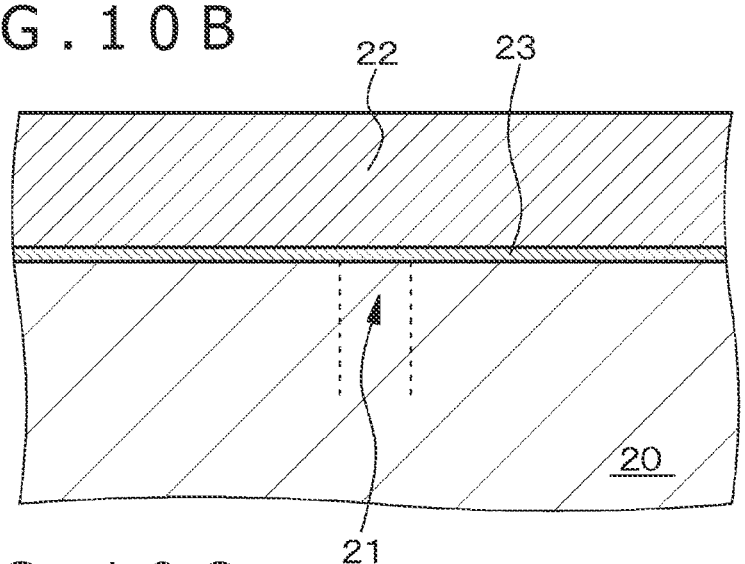
Figure 10C:
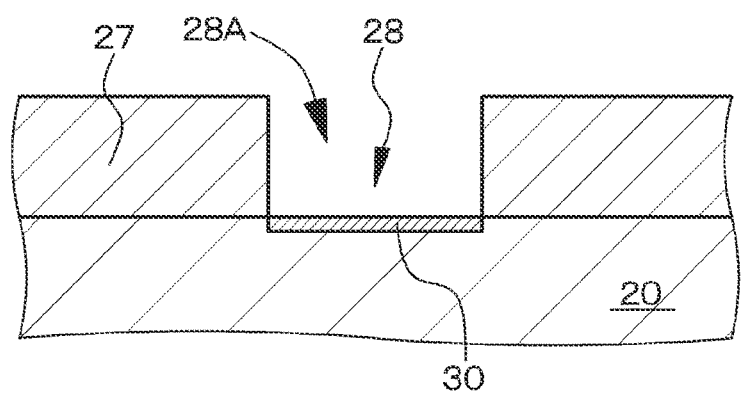

Thereafter, a structure illustrated in FIGS. 9A, 9B, and 9C can be obtained by performing a step similar to [step-120] of the embodiment 1. Further, a structure illustrated in FIGS. 10A, 10B, and 10C can be obtained by performing a step similar to [step-120] of the embodiment 1, and further, the structure illustrated in FIGS. 7A, 7B, and 7C can be obtained by performing a step similar to [step-130] of the embodiment 1.

Embodiment 3

Figure 22B:
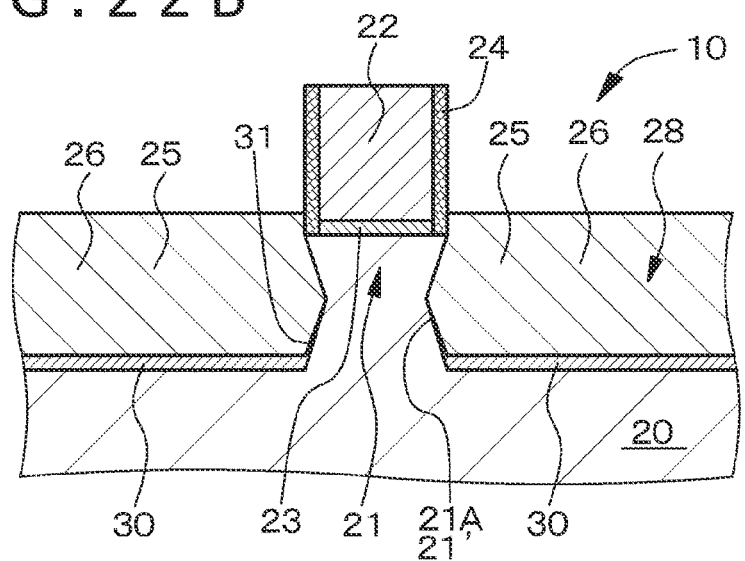
Figure 23:
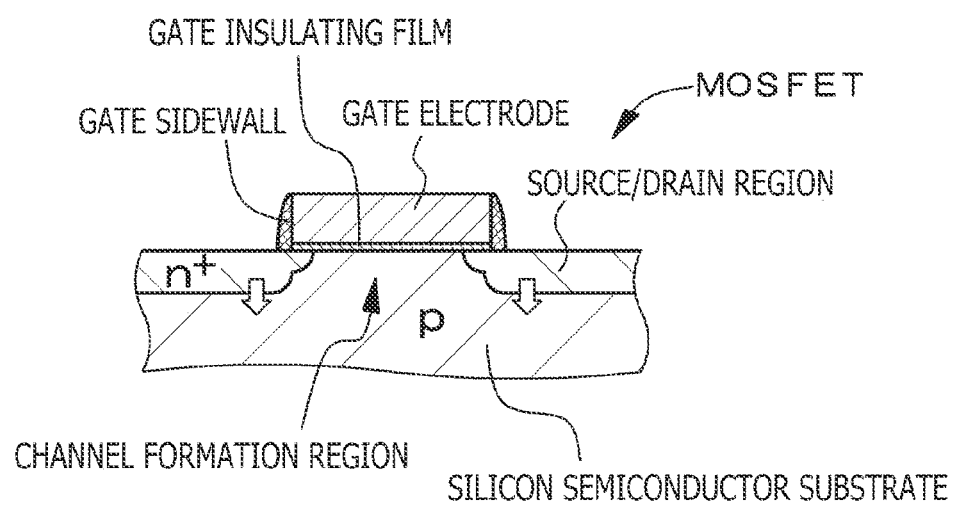
FIG. 23 is a schematic partial cross-sectional view of a conventional planar type semiconductor device.

This embodiment 3 is also a modification of the embodiment 1. In the semiconductor device according to the embodiment 2, since the cross-sectional shape of each of the side faces 21A of the channel portion 21 that are opposite to the side faces of the semiconductor layers 26 has the recessed shape, the high-concentration impurity layers are more unlikely to be formed on the boundary regions 21' between the channel portion 21 and the source/drain regions 25. However, there may occur a situation in which the high-concentration impurity layers (the second impurity layers 31) are, albeit only slightly, formed on a lower portion of the boundary regions 21' between the channel portion 21 and the source/drain regions 25 although the occurrence depends on conditions for forming impurity layers 30 and any other condition (see FIG. 22B, which is a schematic partial cross-sectional view of another example of the semiconductor device according to the embodiment 2, taken in a way similar to that along the arrow A-A of FIG. 2). In the embodiment 3, in the middle of a manufacturing process for the semiconductor device, offset spacers (protection layers) 29 are formed on the side faces of the channel portion 21, and this configuration further more reliably reduces the formation of the high-concentration impurity layers on the boundary regions 21' between the channel portion 21 and the source/drain regions 25.

Figure 5A:
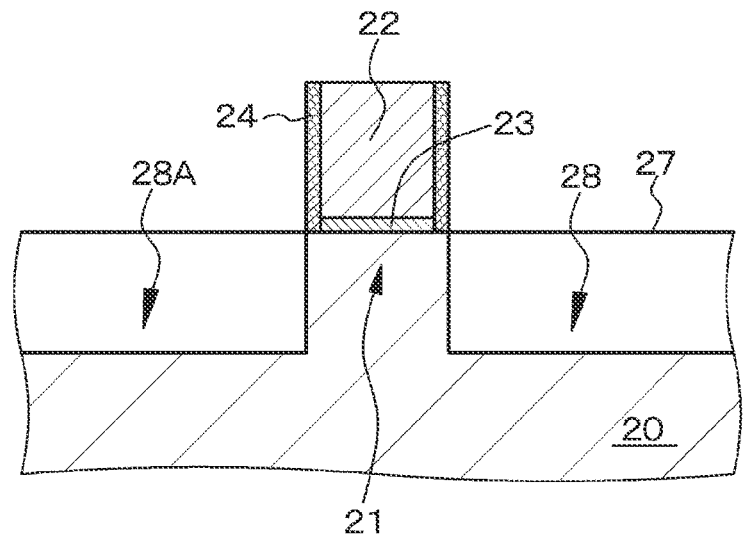
FIG. 5A, FIG. 5B, and FIG. 5C are a schematic partial cross-sectional view, a schematic partial edge view, and a schematic partial edge view of the base body and other elements, taken in a way similar to that along the arrow A-A, the arrow B-B, and the arrow C-C of FIG. 2, for the purpose of describing the manufacturing method for the semiconductor device according to the embodiment 1, following the description using the FIG. 4A, FIG. 4B, and FIG. 4C.
Figure 5B:
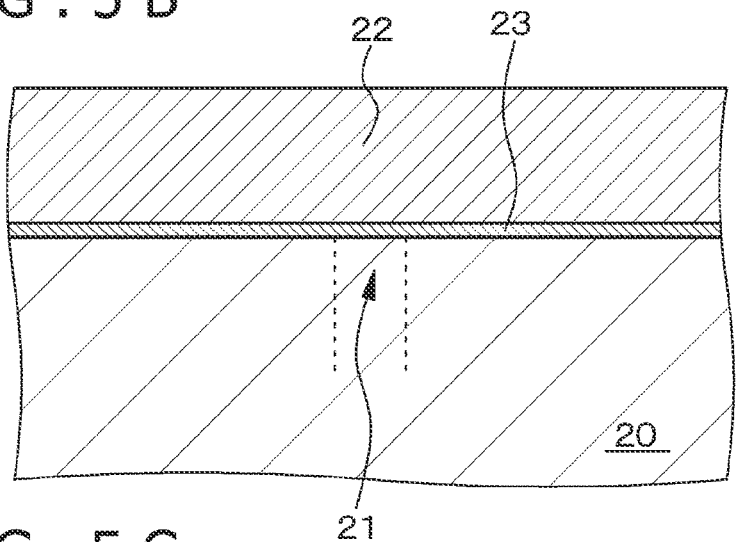
Figure 5C:
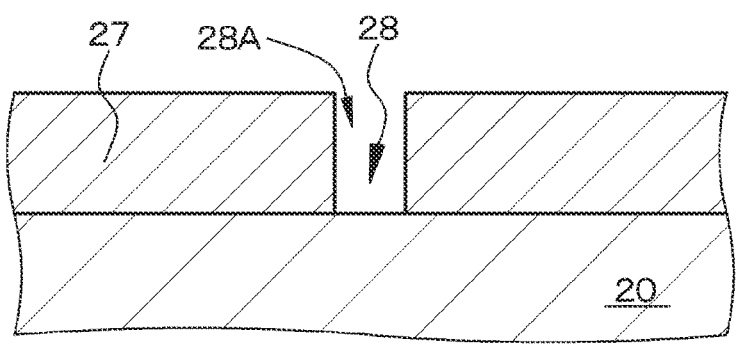
Figure 6A:
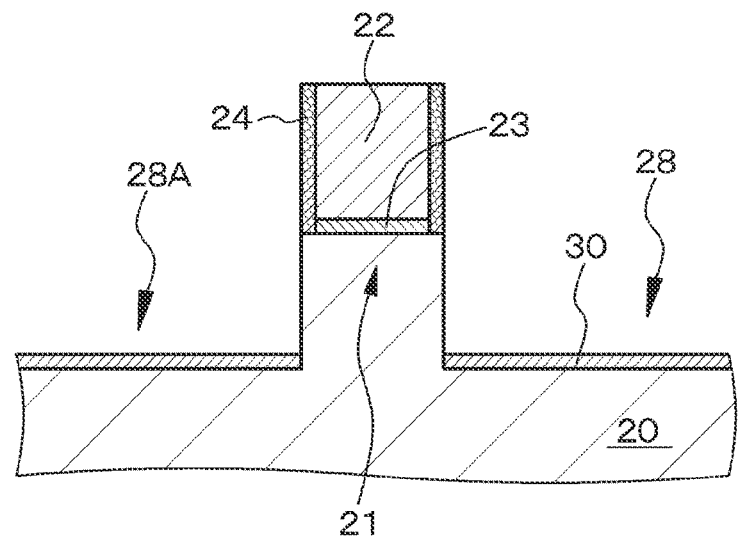
FIG. 6A, FIG. 6B, and FIG. 6C are schematic partial edge views of the base body and other elements, taken in a way similar to that along the arrow A-A, the arrow B-B, and the arrow C-C of FIG. 2, for the purpose of describing the manufacturing method for the semiconductor device according to the embodiment 1, following the description using the FIG. 5A, FIG. 5B, and FIG. 5C.
Figure 6B:
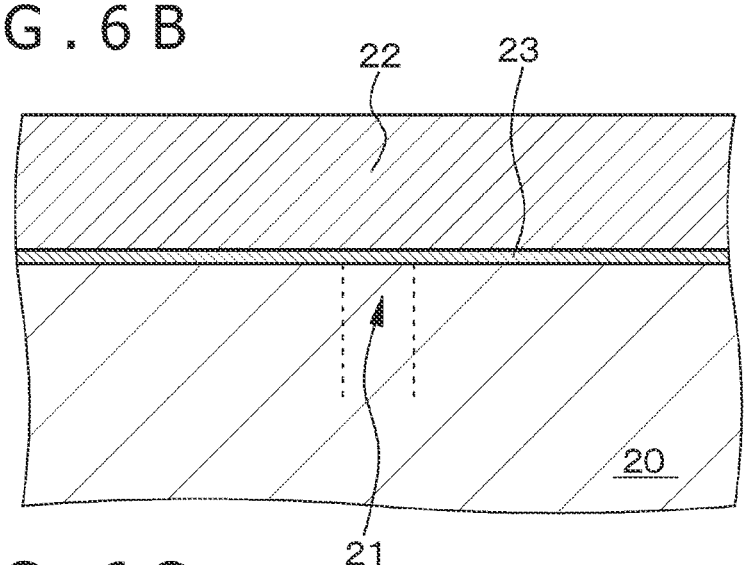
Figure 6C:
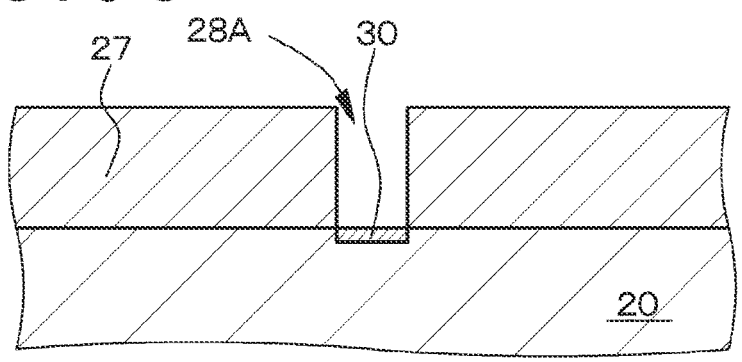
Figure 11A:
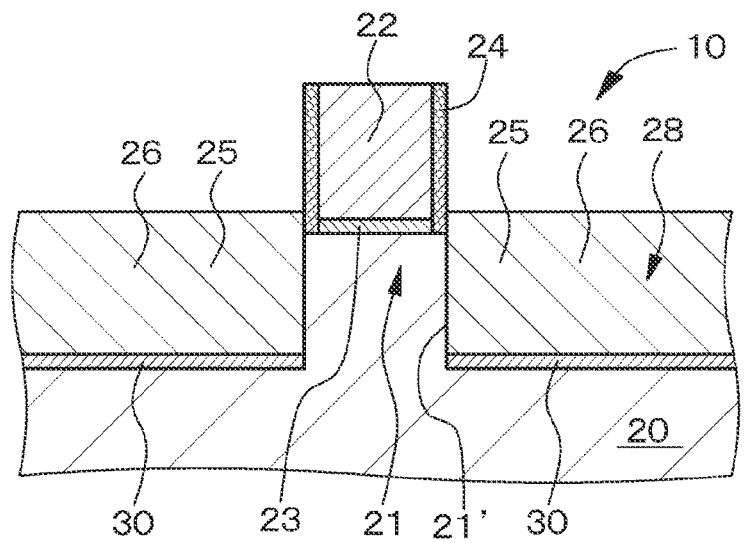
FIG. 11A, FIG. 11B, and FIG. 11C are schematic partial cross-sectional views of a semiconductor device according to an embodiment 3, taken in a way similar to that along the arrow A-A, the arrow B-B, and the arrow C-C of FIG. 2.
Figure 11B:
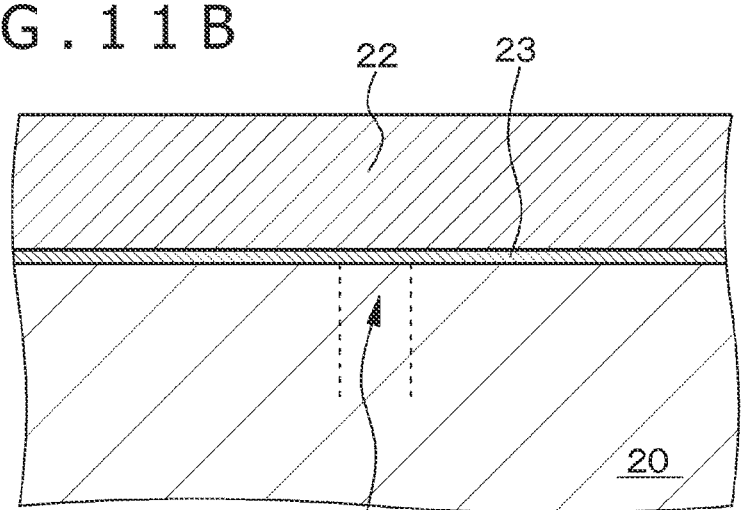
Figure 11C:
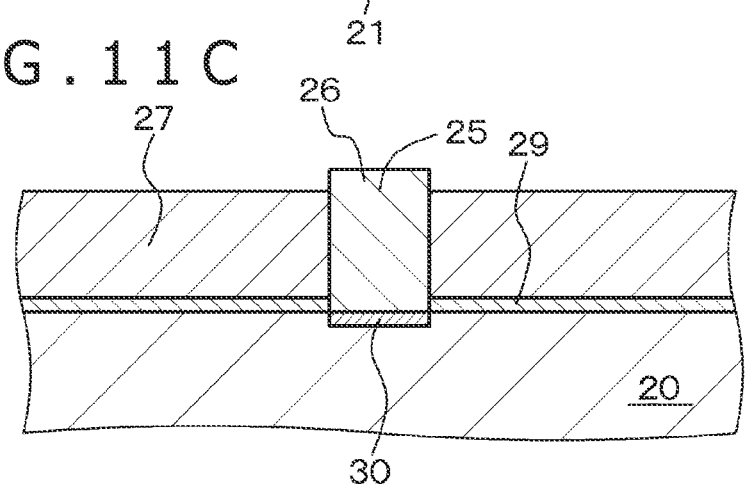
Figure 12A:
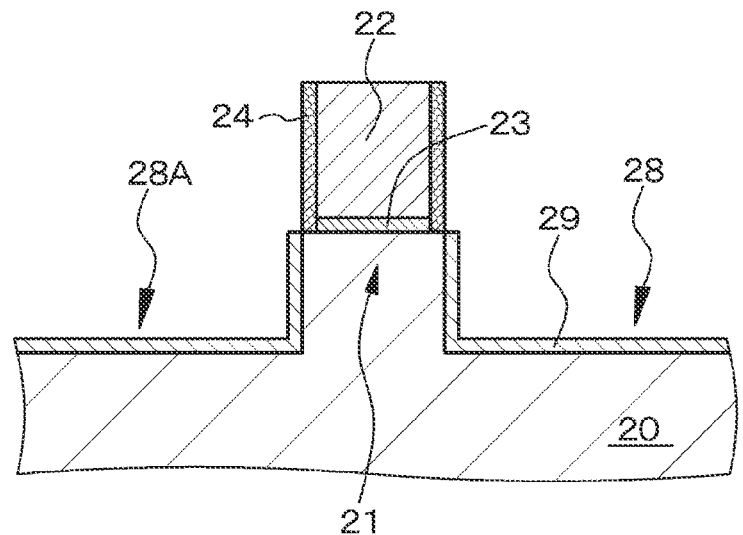
FIG. 12A, FIG. 12B, and FIG. 12C are schematic partial edge views of the base body and other elements, taken in a way similar to that along the arrow A-A, the arrow B-B, and the arrow C-C of FIG. 2, for the purpose of describing a manufacturing method for the semiconductor device according to the embodiment 3.
Figure 12B:
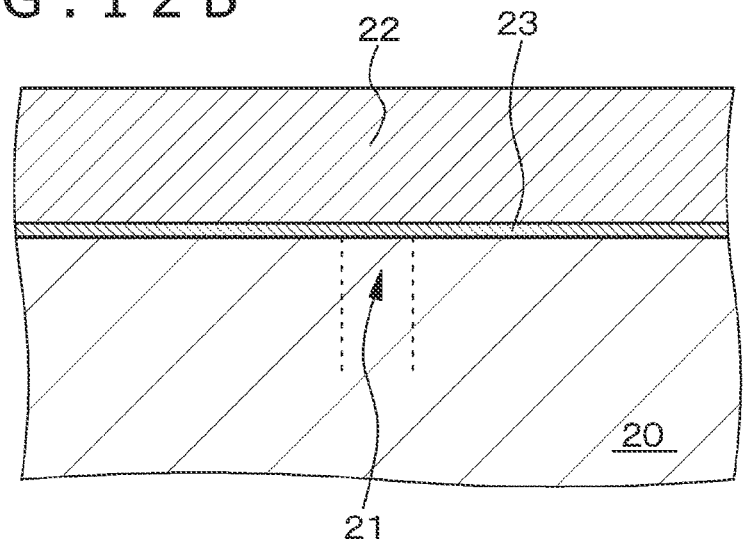
Figure 12C:
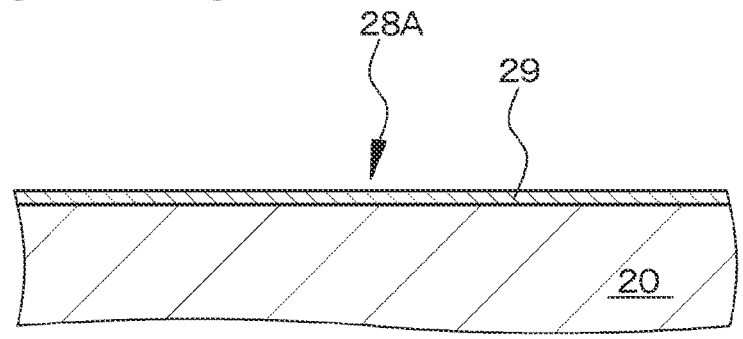
Figure 13A:
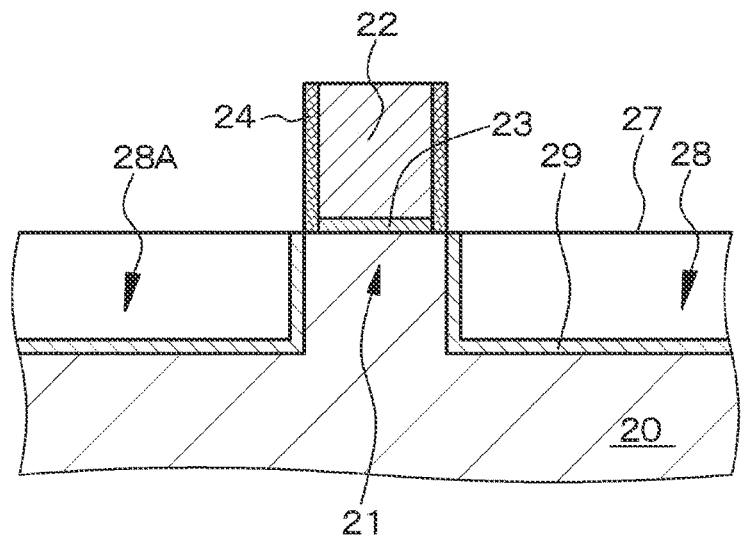
FIG. 13A, FIG. 13B, and FIG. 13C are a schematic partial cross-sectional view, a schematic partial edge view, and a schematic partial edge view of the base body and other elements, taken in a way similar to that along the arrow A-A, the arrow B-B, and the arrow C-C of FIG. 2, for the purpose of describing the manufacturing method for the semiconductor device according to the embodiment 3, following the description using FIG. 12A, FIG. 12B, and FIG. 12C.
Figure 13B:
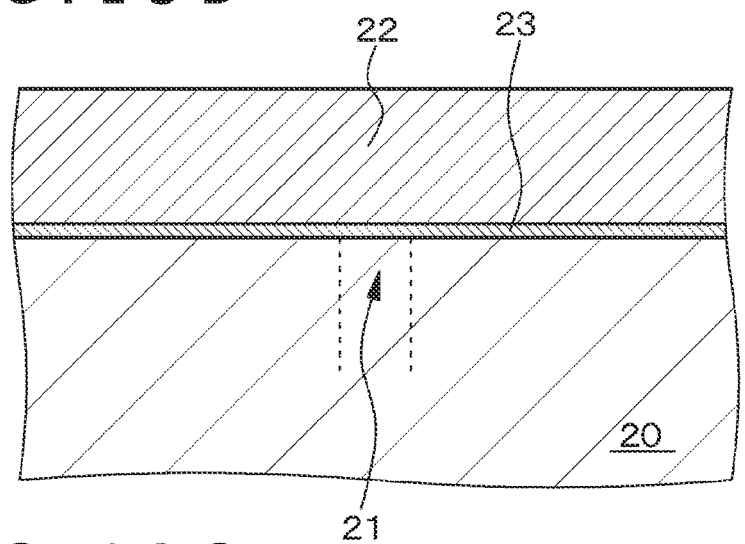
Figure 13C:
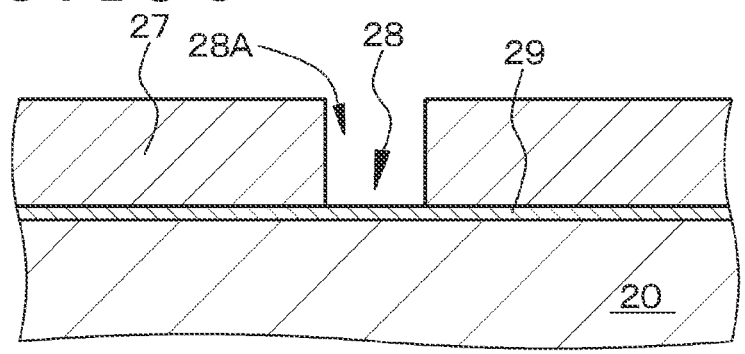
Figure 14A:
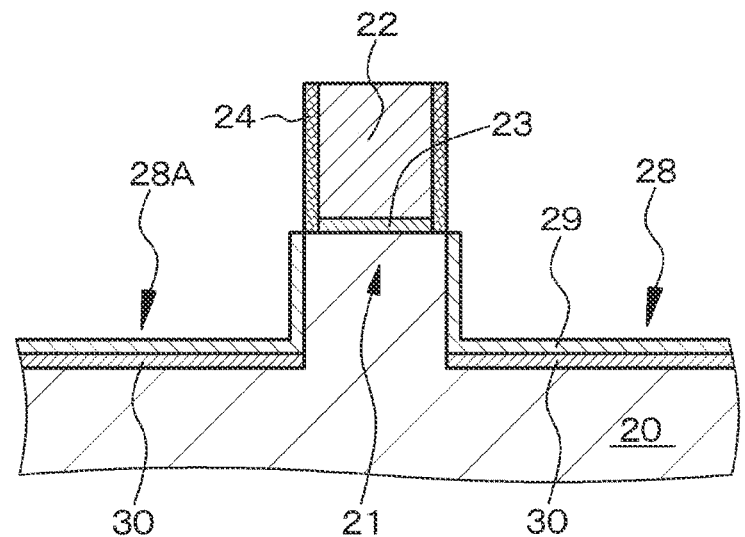
FIG. 14A, FIG. 14B, and FIG. 14C are schematic partial edge views of the base body and other elements, taken in a way similar to that along the arrow A-A, the arrow B-B, and the arrow C-C of FIG. 2, for the purpose of describing the manufacturing method for the semiconductor device according to the embodiment 3, following the description using FIG. 13A, FIG. 13B, and FIG. 13C.
Figure 14B:
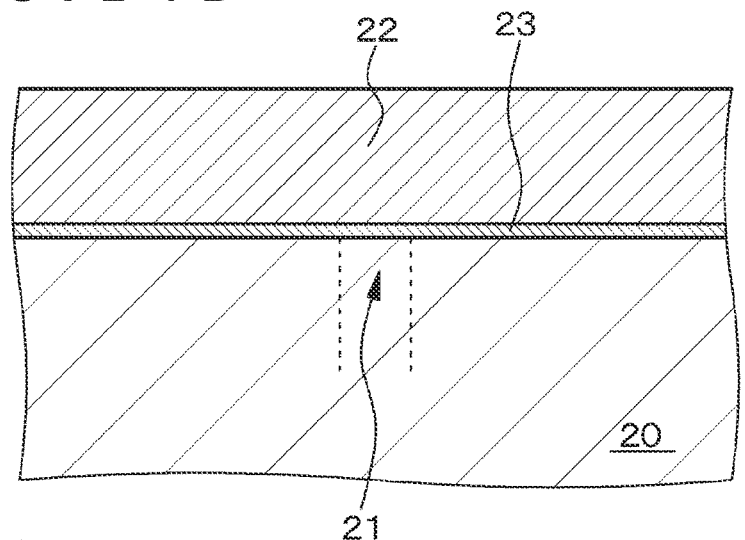
Figure 14C:
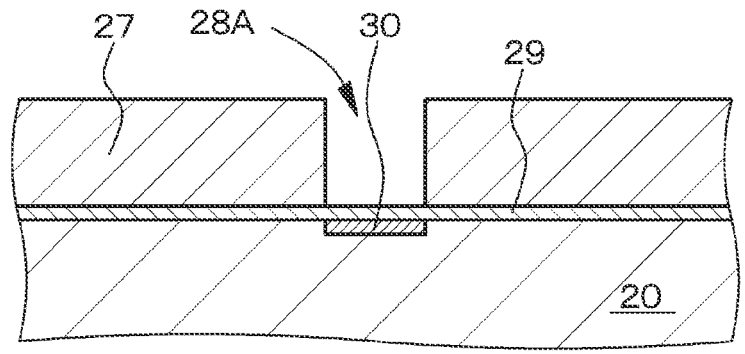
Figure 15A:
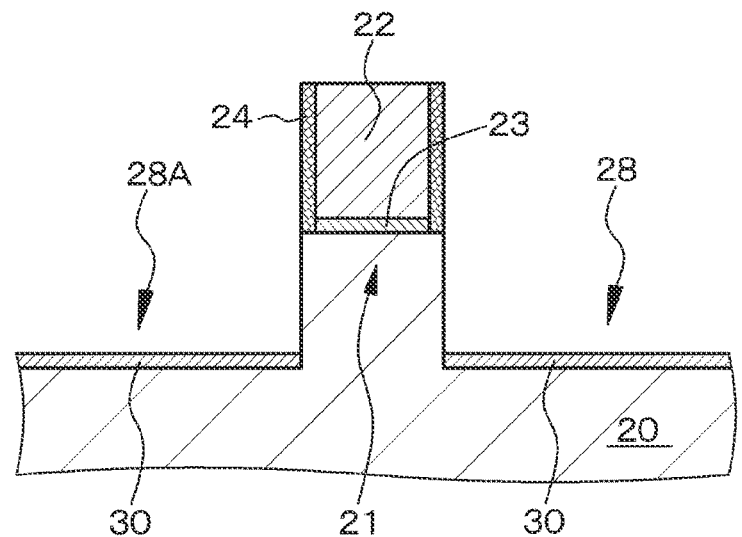
FIG. 15A, FIG. 15B, and FIG. 15C are schematic partial edge views of the base body and other elements, taken in a way similar to that along the arrow A-A, the arrow B-B, and the arrow C-C of FIG. 2, for the purpose of describing the manufacturing method for the semiconductor device according to the embodiment 3, following the description using FIG. 14A, FIG. 14B, and FIG. 14C.
Figure 15B:
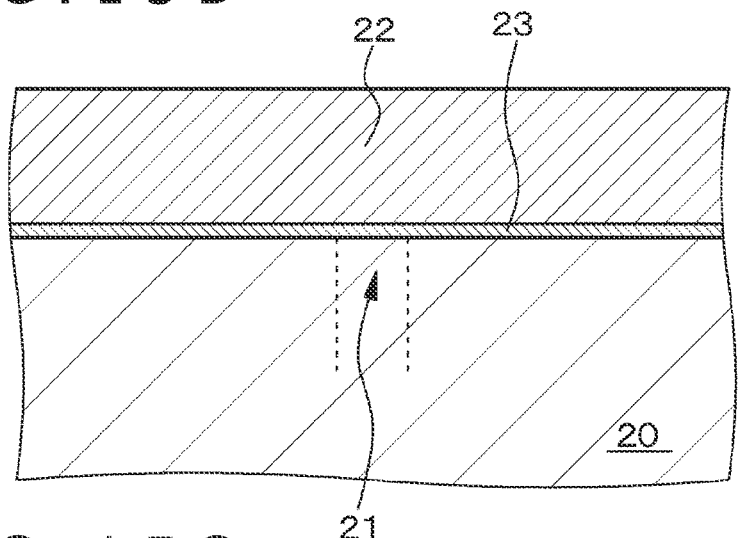
Figure 15C:
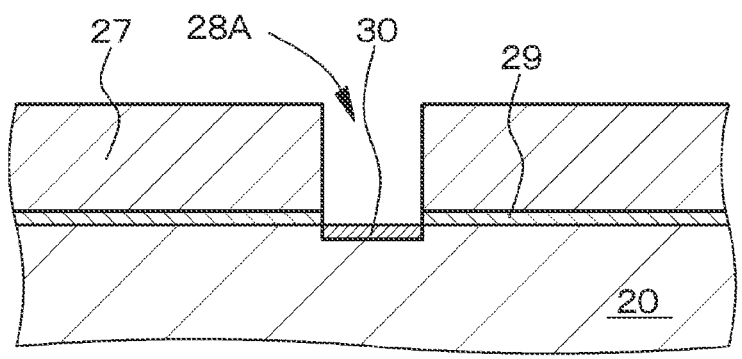

Specifically, in a manufacturing method for the semiconductor device according to the embodiment 3, subsequent to performing steps similar to [step-100] and [step-110] of the embodiment 1, the structure illustrated in FIGS. 5A, 5B, and 5C is obtained by performing a step similar to [step-120] of the embodiment 1, and then, the offset spacers (protection layers) 29 against ion implantation are formed on the obtained source/drain region formation planned regions 28A and the side faces of the channel portion 21. The offset spacer 29 is made of $SiO_2$, SiN, or the like, and its thickness is approximately 1 to 5 nm. In this way, a structure illustrated in FIGS. 12A, 12B, and 12C can be obtained. Next, subsequent to performing a step similar to [step-120] of the embodiment 1 (see FIGS. 13A, 13B, and 13C), desired regions are covered using the ion-implantation masks, and the impurity layers (high-concentration impurity layers) 30 having the second conductivity type (for example, $p^{++}$) are formed in the bottom portions of the recessed portions 28, which correspond to the source/drain region formation planned regions 28A, on the basis of the ion implantation method. Thereafter, the activation annealing treatment is performed, and then, the ion-implantation masks are removed. In this way, a structure illustrated in FIGS. 14A, 14B, and 14C can be obtained. Thereafter, the offset spacers (protection layers) 29 are removed, and thereby a structure illustrated in FIGS. 15A, 15B, and 15C can be obtained. Further, additionally, a step similar to [step-130] of the embodiment 1 is performed, and thereby a structure illustrated in FIGS. 11A, 11B, and 11C can be obtained.

Embodiment 4

Figure 16:
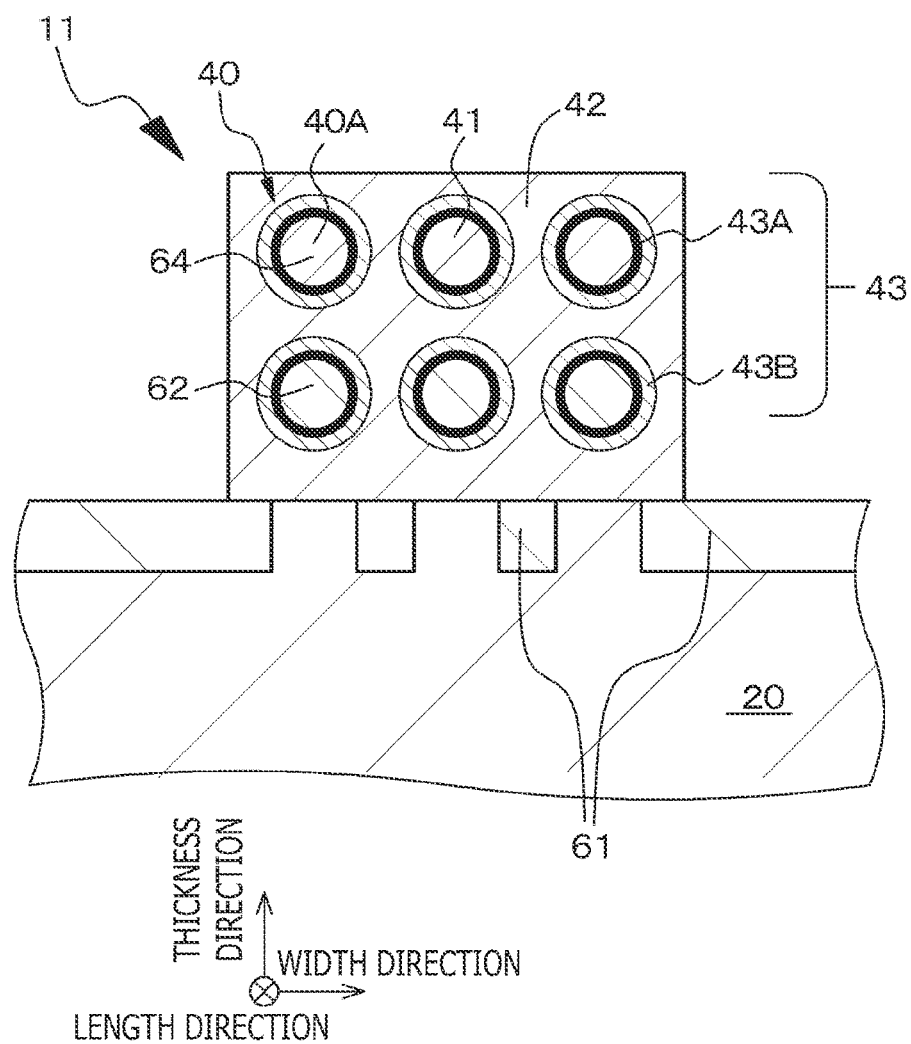
FIG. 16 is a schematic partial edge view of a semiconductor device according to an embodiment 4, taken along an arrow A-A of FIG. 17A.
Figure 17A:
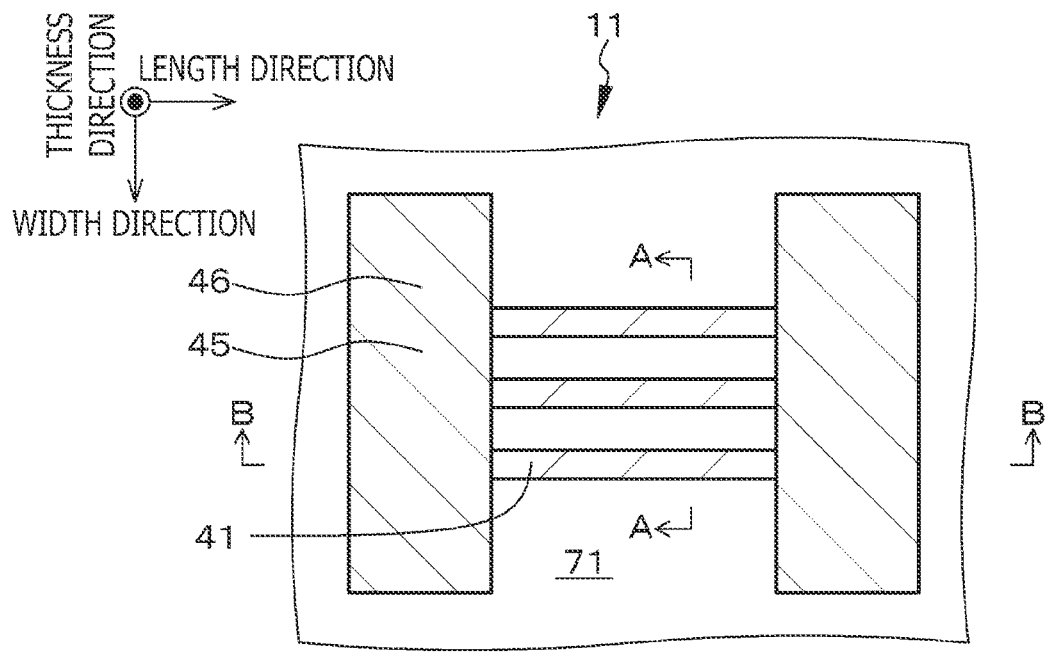
FIG. 17A and FIG. 17B are respectively a schematic layout diagram of channel portions and source/drain regions of the semiconductor device according to the embodiment 4 and a schematic partial view of some elements of the semiconductor device according to the embodiment 4, taken along an arrow B-B of FIG. 17A.
Figure 17B:
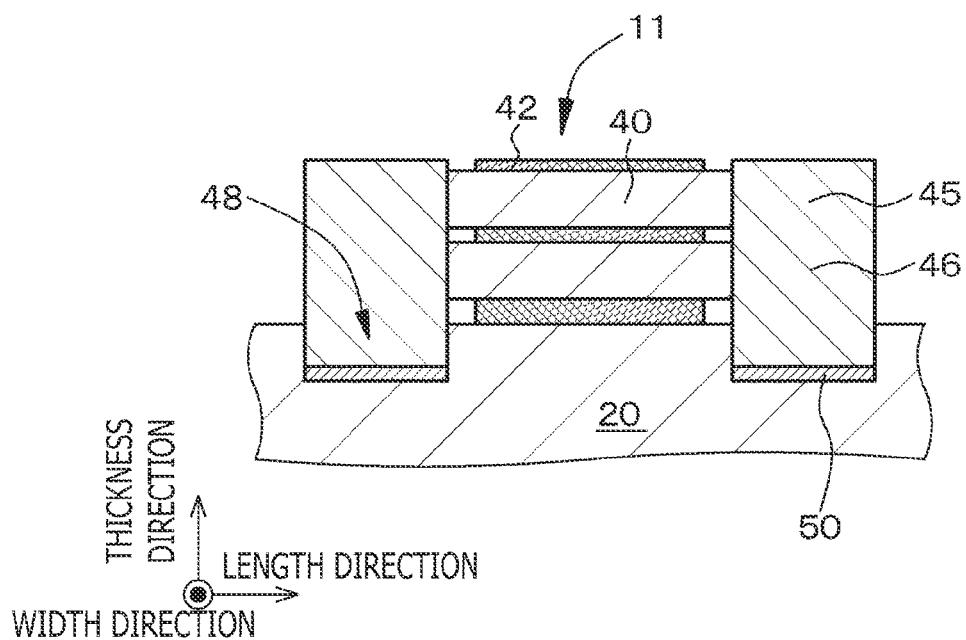

This embodiment 4 is also a modification of the embodiment 1. The semiconductor device has the nano-wire structure or the nano-sheet structure and, in this embodiment 4, specifically, has the nano-wire structure. The gate electrode 22 is formed so as to extend from the top face of the channel portion 21 to the side faces thereof, and further to the bottom face thereof, and thus has the GAA structure. FIG. 16 illustrates a schematic partial edge view of the semiconductor device according to the embodiment 4, taken along an arrow A-A of FIG. 17A, FIG. 17B illustrates a schematic partial edge view of the semiconductor device according to the embodiment 4, taken along an arrow B-B of FIG. 17A, and FIG. 17A illustrates a schematic layout diagram of channel portions and source/drain regions of the semiconductor device according to the embodiment 4. Note that, in FIGS. 17A and 17B, the gate electrode and the gate insulating film are omitted from illustration.

A semiconductor device 11 according to the embodiment 4 also includes channel portions 41, a gate electrode 42 disposed opposite the channel portions 41 via gate insulating films 43, and source/drain regions 45 disposed at both edges of the channel portions 41. The source/drain regions 45 include semiconductor layers 46 that have the first conductivity type (specifically, for example, n$^+$) and that are formed inside recessed portions 48 disposed on the base body 20 made of the silicon semiconductor substrate. Impurity layers (high-concentration impurity layers) 50 having the second conductivity type (specifically, for example, p$^{++}$) different from the first inductivity type are formed between the base body 20 and bottom portions of the semiconductor layers 46.

Specifically, the semiconductor device 11 according to the embodiment 4 includes at least two channel structure portions 40 (two ones in the thickness direction in the illustrated example) having nano-wire structures 40A, and the channel structure portions 40 are arranged apart from each other in the thickness direction of the semiconductor device 11. Further, in the illustrated example, the channel structure portions 40 each include three nano-wire structures 40A in the width direction. Here, in the semiconductor device according to the present embodiment 4, the channel structure portions 40 each include the channel portions 41 made of silicon, the gate insulating films 43, and the gate electrode 42. Further, gate insulating films 43 and the gate electrode 42 are formed between a channel portion 41 and an adjacent channel portion 41, and the gate insulating films 43 and the gate electrode 42 are embedded between the channel portion 41 and the adjacent channel portion 41. The semiconductor device is assumed to be, for example, an n-channel type. Examples of a material constituting the gate electrode 42 include TiN, TaN, Al, TiAl, and W. Further, a gate insulating film 43A constituting a portion of the gate insulating film 43 is made of SiON, and a gate insulating film 43B constituting the remaining portion of the gate insulating film 43 is made of a high dielectric constant material, specifically, HfO$_2$.

Hereinafter, the outline of a manufacturing method for the semiconductor device according to the embodiment 4 will be described with reference to FIGS. 18A, 18B, 18C, 19, 19B, 20A, 20B, 20C, 21A, and 21B. Here, FIGS. 18A, 18B, 18C, 19, 19B, 20A, and 20B are schematic partial edge views taken in a way similar to that along the arrow A-A of FIG. 17A, and FIGS. 20C, 21A, and 21B are schematic partial edge views taken in a way similar to that along the arrow B-B of FIG. 17A.

[Step-400]

First, a first sacrificial layer 61 made of SiGe is formed on a desired region of the base body 20, and subsequently, a first semiconductor layer 62 made of Si is formed on the first sacrificial layer 61.

[Step-400A]

Specifically, first, the first sacrificial layer 61 made of SiGe is formed on the entire face of the base body 20 on the basis of an epitaxial CVD method, and then, an etching resist having a desired resist pattern is formed on the first sacrificial layer 61. Following this, the etching resist is removed subsequent to patterning of the first sacrificial layer 61, and thereby the first sacrificial layer 61 can be formed on a desired region.

[Step-400B]

Next, the first semiconductor layer 62 made of Si is formed on the entire face on the basis of the epitaxial CVD method, and then, an etching resist having a desired resist pattern is formed on the first semiconductor layer 62. Further, the etching resist is removed subsequent to patterning of the first semiconductor layer 62, and thereby the first semiconductor layer 62 can be formed on the first sacrificial layer 61.

[Step-410]

Next, a second sacrificial layer 63 made of SiGe is formed on the first semiconductor layer 62, and then, a second semiconductor layer 64 made of Si is formed on the second sacrificial layer 63.

[Step-410A]

Specifically, the second sacrificial layer 63 made of SiGe is formed on the entire face on the basis of the epitaxial CVD method, and then, an etching resist having a desired resist pattern is formed on the second sacrificial layer 63. Further, the etching resist is removed subsequent to patterning of the second sacrificial layer 63, and thereby the second sacrificial layer 63 can be formed on the first semiconductor layer 62.

[Step-410B]

Next, the second semiconductor layer 64 made of Si is formed on the entire face on the basis of the epitaxial CVD method, and then, an etching resist having a desired resist pattern is formed on the second semiconductor layer 64. Further, the etching resist is removed subsequent to patterning of the second semiconductor layer 64, and thereby the second semiconductor layer 64 can be formed on the second sacrificial layer 63. In this way, a structure illustrated in FIG. 18A can be obtained.

[Step-420]

Thereafter, a laminated structure 40" including the first sacrificial layer 61, the first semiconductor layer 62, the second sacrificial layer 63, and the second semiconductor layer 64 is formed, and then, partial portions of the second sacrificial layer 63 and the first sacrificial layer 61 in the laminated structure 40" are removed.

[Step-420A]

Figure 18A:
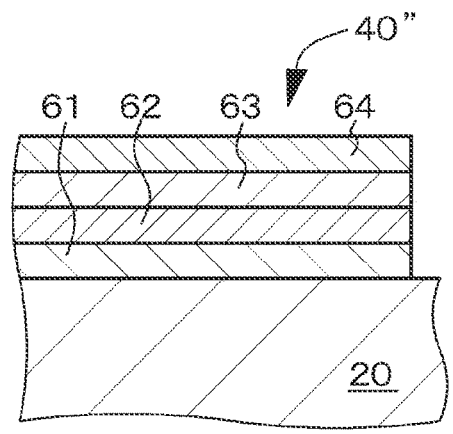
FIG. 18A, FIG. 18B, and FIG. 18C are schematic partial edge views of a base body and other elements, taken in a way similar to that along the arrow A-A of FIG. 17, for the purpose of describing a manufacturing method for the semiconductor device according to the embodiment 4.
Figure 18B:
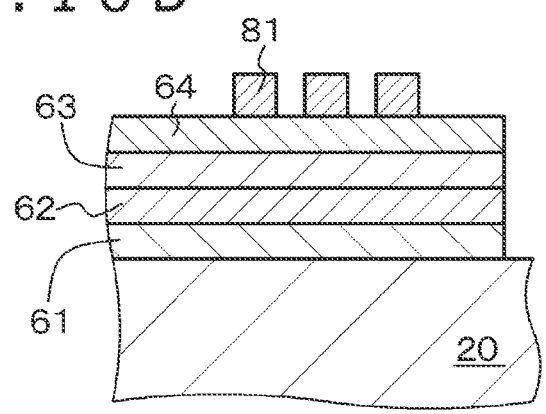
Figure 18C:
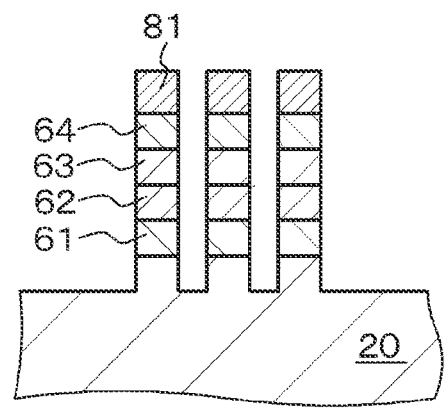

Specifically, etching resists 81 having desired resist patterns are formed on the entire face (see FIG. 18B). Further, the patterning of each of the second semiconductor layer 64, the second sacrificial layer 63, the first semiconductor layer 62, and the first sacrificial layer 61 is performed, and further, etching of partial portions of the base body 20 is performed. As a result, the nano-wire structures 40A are obtained, or nano-sheet structures are obtained, according to the widths of the etching resists 81. In this way, a structure illustrated in FIG. 18C can be obtained.

[Step-420B]

Figure 19A:
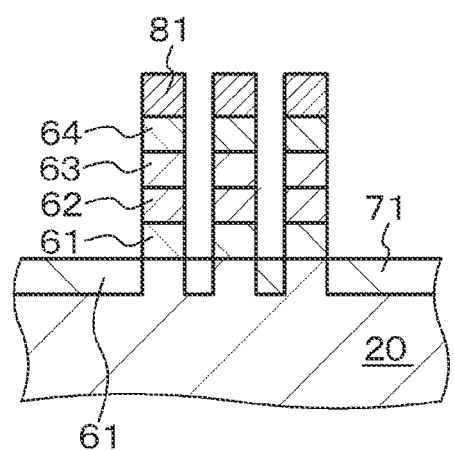
FIG. 19A and FIG. 19B are schematic partial edge views of the base body and other elements, taken in a way similar to that along the arrow A-A of FIG. 17, for the purpose of describing the manufacturing method for the semiconductor device according to the embodiment 4, following the description using FIG. 18C.
Figure 19B:
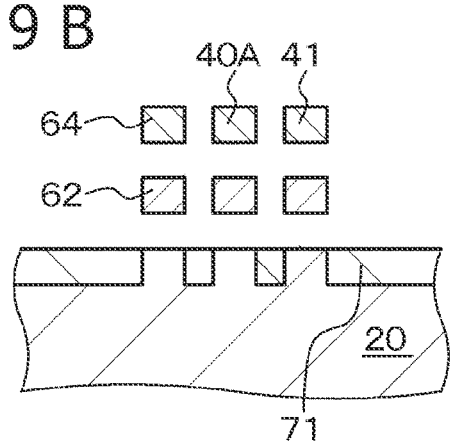

Next, subsequent to forming a dielectric material layer made of SiO$_2$ on the entire face, on the basis of the CVD method, a planarizing process is performed, and thereby, element separation regions 71 can be obtained (see FIG. 19A).

[Step-420C]

Further, the first sacrificial layer 61 and the second sacrificial layer 63 each being made of SiGe are removed by applying etchant having an etching selection ratio to the materials (Si) constituting the first semiconductor layer 62 and the second semiconductor layer 64. Both edges of each of the channel portions 41 including the nano-wire structures 40A are supported by support portions each including the laminated structure 40". Thereafter, the etching resists 81 are removed. In this way, a structure illustrated in FIG. 19B can be obtained.

[Step-430]

Thereafter, the gate insulating films 43A and 43B and the gate electrode 42 are formed on the channel portions 41.

Figure 20A:
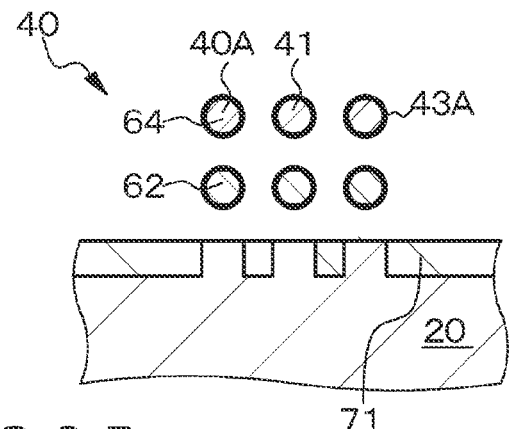
FIG. 20A and FIG. 20B are schematic partial edge views of the base body and other elements, taken in a way similar to that along the arrow A-A of FIG. 17, for the purpose of describing the manufacturing method for the semiconductor device according to the embodiment 4, following the description using FIG. 19B.

[Step-430A] Specifically, first, the gate insulating films 43A, each being a portion of the gate insulating film and being made of SiON, are formed by forming a resist layer (not illustrated) having a desired resist pattern and by performing a thermal oxidation process on the channel portions 41 (see FIG. 20A). As the result of the thermal oxidation process, the cross-sectional shape of each of the channel portions 41 including the nano-wire structures becomes a circular shape.

[Step-430B]

Figure 20B:
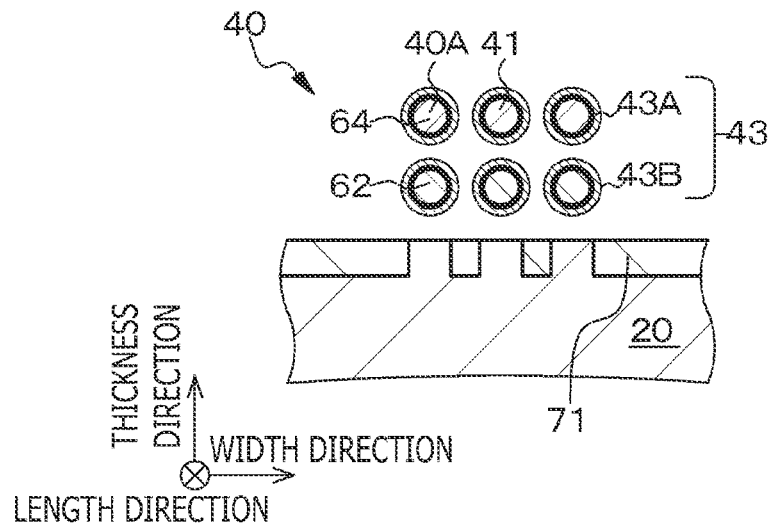

Next, the gate insulating films 43B, each being the remaining portion of the gate insulating film and being made of $HfO_2$, are formed on the gate insulating films 43A on the basis of an ALD method (see FIG. 20B).

[Step-430C]

Figure 20C:
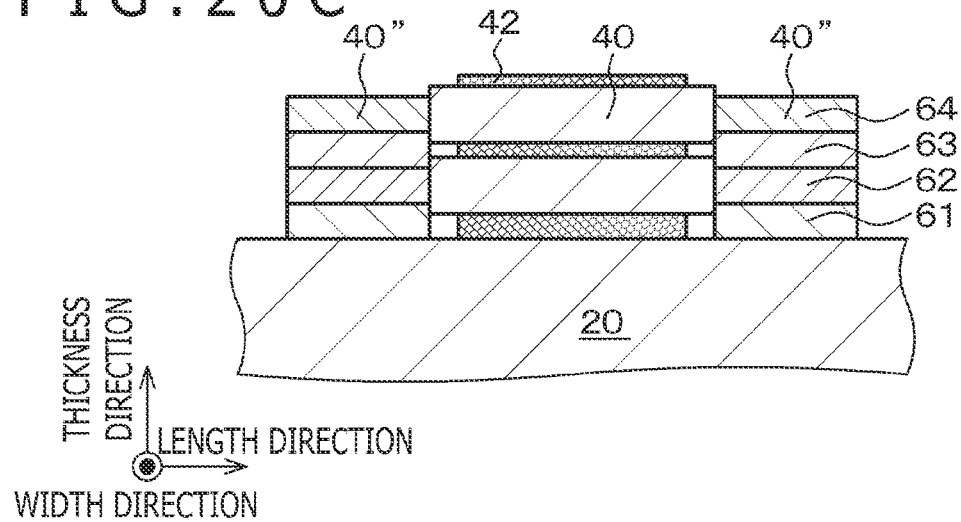
FIG. 20C is a schematic partial edge view of the base body and other elements, taken in a way similar to that along the arrow B-B of FIG. 17.

Thereafter, the gate electrode 42 is formed on the gate insulating films 43 by forming a material layer constituting the gate electrode on the entire face, on the basis of the CVD method, and performing patterning of this material layer (see FIG. 20C).

In this way, subsequent to the formation of the channel portions, the gate electrode 42 opposite the channel portions 41 via the gate insulating films can be formed.

[Step-440]

Figure 21A:
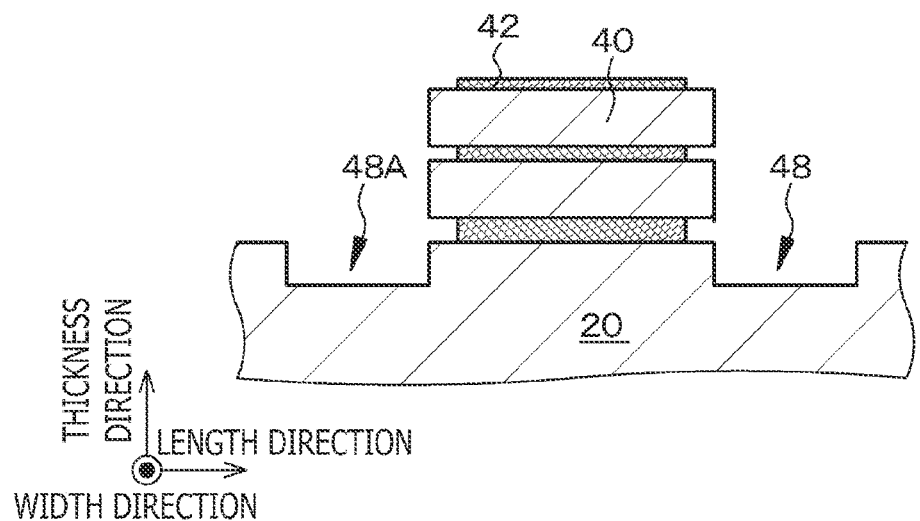
FIG. 21A and FIG. 21B are schematic partial edge views of the base body and other elements, taken in a way similar to that along the arrow B-B of FIG. 17, for the purpose of describing the manufacturing method for the semiconductor device according to the embodiment 4, following the description using FIG. 20C.

Next, source/drain region formation planned regions 48A are obtained by partially removing regions of the base body 20 in which the source/drain regions 45 are to be formed, in the thickness direction (see FIG. 21A). Specifically, recessed portions 48 can be obtained by removing the support portions supporting the both edges of each of the channel portions 41 and including the laminated structures 40", to expose the base body 20, and further, by partially removing the regions of the base body 20 in the thickness direction. The recessed portions 48 correspond to the source/drain region formation planned regions 48A.

[Step-450]

Figure 21B:
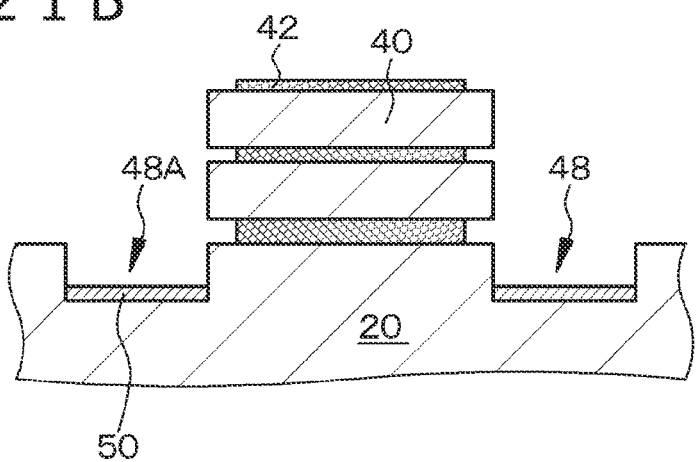

Thereafter, impurity layers 50 having the second conductivity type (specifically, for example, $p^{++}$) are formed in the source/drain region formation planned regions 48A (bottom portions of the recessed portions 48) (see FIG. 21B). Specifically, desired regions are covered using the ion-implantation masks, and the impurity layers 50 having the second conductivity type are formed in the bottom portions of the recessed portions 48 corresponding to the source/drain region formation planned regions 48A, on the basis of the ion implantation method. Thereafter, the activation annealing treatment is performed, and then, the ion-implantation masks are removed. Further, the source/drain regions 45 including the semiconductor layers 46 having the first conductivity type (specifically, for example, $n^+$) different from the second conductivity type are formed on the impurity layers 50. The formation of the semiconductor layers 46 on the impurity layers 50 is based on the epitaxial growth method. Specifically, the semiconductor layers 46, each being made of silicon containing impurities having the first conductivity type, are caused to grow from the impurity layers 50 made of silicon, on the basis of the epitaxial growth method. In this way, the semiconductor device that has the nano-wire structure and that is illustrated in FIGS. 16, 17A, and 17B can be obtained. Further, it is sufficient just to, in addition to the above, form inter-layer insulating layers on the entire face, form openings in inter-layer insulating layers located above the gate electrode 42 and the source/drain regions 45, and form connection holes and wirings from inside the openings up to the inter-layer insulating layers.

Heretofore, the present disclosure has been described on the basis of the preferred embodiments, but the configurations and structures of the semiconductor devices, the materials constituting the semiconductor devices, and the manufacturing methods for the semiconductor devices described in the embodiments are just examples, and can appropriately be changed. Further, the order of steps in the manufacturing method for the semiconductor device in each of the embodiments can appropriately be changed as desired. In the embodiment 4, the channel portions have been described exclusively on the basis of the nano-wire structure, but the channel portions can also have the nano-sheet structure. Further, in the embodiment 4, a form in which the channel portions extend in parallel to the surface of the base body has been described, but another form in which the channel portions extend in a direction perpendicular to the surface of the base body can also be employed alternatively. In the case where the channel portions extend in the direction perpendicular thereto, the configuration of the semiconductor device according to the present disclosure can be applied to source/drain regions (source regions or drain regions) located below the channel portions. In the embodiments, the semiconductor devices have been supposed to be of the n-channel type, but the semiconductor devices may alternatively be of a p-channel type. Further, in this case, it is sufficient just to appropriately change the materials constituting the semiconductor devices. As the base body, an SOI substrate, a GOI substrate, or an SGOI substrate may be used instead of the silicon semiconductor substrate.

Here, the present disclosure can also have configurations described below.

[A01] <<Semiconductor Device>>

A semiconductor device including:

a channel portion;

a gate electrode disposed opposite the channel portion via a gate insulating film; and source/drain regions disposed at both edges of the channel portion, in which the source/drain regions include semiconductor layers that have a first conductivity type and that are formed inside recessed portions disposed on a base body, and impurity layers having a second conductivity type different from the first conductivity type are formed between the base body and bottom portions of the semiconductor layers.

[A02]

The semiconductor device according to [A01], in which the channel portion includes a partial region of the base body, and a cross-sectional shape of each of side faces of the channel portion that are opposite to side faces of the semiconductor layers has a recessed shape.

[A03]

The semiconductor device according to [A01] or [A02]

in which the channel portion includes a partial region of the base body, and no impurity layer is formed between the partial region of the base body that constitutes the channel portion and the semiconductor layers.

[A04]

The semiconductor device according to [A01], in which the channel portion includes a partial region of the base body, second impurity layers are formed between the partial region of the base body that constitutes the channel portion and the semiconductor layers, and when an average thickness of the impurity layers is denoted by $T_1$ and an average thickness of the second impurity layers is denoted by $T_2$, an inequality represented by $0 \leq T_2/T_1 \leq 0.5$ is satisfied.

[A05]

The semiconductor device according to any one of [A01] to [A04], in which an impurity concentration $C_1$ of the impurity layers is higher than an impurity concentration $C_2$ of the semiconductor layers.

[A06]

The semiconductor device according to any one of [A01] to [A04], in which, when an impurity concentration of the impurity layers is denoted by $C_1$ and an impurity concentration of the semiconductor layers is denoted by $C_2$, an inequality represented by $0.1 \leq C_2/C_1 \leq 10$ is satisfied.

[A07]

The semiconductor device according to any one of [A01] to [A06], having a Fin structure.

[A08]

The semiconductor device according to any one of [A01] to [A06], having a nano-wire structure or a nano-sheet structure.

[A09]

The semiconductor device according to [A08], in which the gate electrode is formed so as to extend from a top face of the channel portion to side faces of the channel portion, and further to a bottom face of the channel portion.

[B01] <<Manufacturing Method for Semiconductor Device>>

A manufacturing method for a semiconductor device,
the semiconductor device including
a channel portion,
a gate electrode disposed opposite the channel portion via a gate insulating film, and
source/drain regions disposed at both edges of the channel portion, the method including the steps of:
subsequent to forming the channel portion, forming the gate electrode disposed opposite the channel portion via the gate insulating film;
subsequently, partially removing regions of a base body in which the source/drain regions are to be formed, in a thickness direction, to obtain source/drain region formation planned regions;
subsequently, forming, in the source/drain region formation planned regions, impurity layers having a second conductivity type; and
subsequently, forming, on the impurity layers, the source/drain regions including semiconductor layers having a first conductivity type different from the second conductivity type.

[B02]

The manufacturing method for the semiconductor device, according to [B01],
in which the channel portion includes a partial region of the base body, and
partial removal of the regions of the base body in which the source/drain regions are to be formed is performed in the thickness direction, such that a cross-sectional shape of each of side faces of the channel portion that are opposite to the source/drain region formation planned regions forms a recessed shape.

[B03]

The manufacturing method for the semiconductor device, according to [B01],
in which the channel portion includes a partial region of the base body, and subsequent to the partial removal of the regions of the base body in which the source/drain regions are to be formed, in the thickness direction, offset spacers are formed on the obtained source/drain region formation planned regions and side faces of the channel portion to form the impurity layers via the offset spacers, and subsequently the offset spacers are removed.

[B04]

The manufacturing method for the semiconductor device, according to any one of [B01] to [B03], in which the formation of the semiconductor layers on the impurity layers is based on an epitaxial growth method.

[B05]

The manufacturing method for the semiconductor device, according to any one of [B01] to [B04], in which the impurity layers are formed in the source/drain region formation planned regions on the basis of an ion implantation method.

REFERENCE SIGNS LIST 10, 11 . . . Semiconductor device, 20 . . . Base body (silicon semiconductor substrate), 21 . . . Channel portion, 21' Boundary region, 21A . . . Side face of channel portion, 22 . . . Gate electrode, 23 . . . Gate insulating film, 24 . . . Gate sidewall, 25 . . . Source/drain region, 26 . . . Semiconductor layer, 27 . . . Insulating layer, 28 . . . Recessed portion, 28A . . . Source/drain region formation planned region, 29 . . . Offset spacer (protection layer), 30 . . . Impurity layer, 31 . . . Second impurity layer, 40 . . . Channel structure portion, 40A . . . Nano-wire structure, 40" . . . Laminated structure, 41 . . . Channel portion, 42 . . . Gate electrode, 43, 43A, 43B . . . Gate insulating film, 45 . . . Source/drain region, 46 . . . Semiconductor layer, 48 . . . Recessed portion, 48A . . . Source/drain region formation planned region, 50 . . . Impurity layer, 61, 63 . . . Sacrificial layer, 62, 64 . . . Semiconductor layer, 71 . . . Element separation region, 81 . . . Etching resist

The invention claimed is:

1. A semiconductor device, comprising:
a channel portion;
a gate electrode disposed opposite the channel portion via a gate insulating film; and
source/drain regions disposed at both edges of the channel portion,
wherein the source/drain regions include semiconductor layers that have a first conductivity type and that are formed inside recessed portions disposed on a base body,
wherein impurity layers having a second conductivity type different from the first conductivity type are formed between the base body and bottom portions of the semiconductor layers, and
wherein a width of the channel portion is equal to a width of each of the source/drain regions.

2. The semiconductor device according to claim 1,
wherein the channel portion includes a partial region of the base body, and
wherein a cross-sectional shape of each side face of the channel portion has a concave shape with respect to each side face of the semiconductor layers that is opposite to each side face of the channel portion.

3. The semiconductor device according to claim 1,
wherein the channel portion includes a partial region of the base body, and wherein no impurity layer is formed between the partial region of the base body that constitutes the channel portion and the semiconductor layer.

4. The semiconductor device according to claim 1, wherein the channel portion includes a partial region of the base body,
wherein second impurity layers are formed between the partial region of the base body that constitutes the channel portion and the semiconductor layer, and
wherein when an average thickness of the impurity layers is denoted by $T_1$ and an average thickness of the second impurity layers is denoted by $T_2$, an inequality represented by $0<T_2/T_1\leq 0.5$ is satisfied.

5. The semiconductor device according to claim 1, wherein an impurity concentration $C_1$ of the impurity layers is higher than an impurity concentration $C_2$ of the semiconductor layers.

6. The semiconductor device according to claim 1, wherein, when an impurity concentration of the impurity layer is denoted by $C_1$ and an impurity concentration of the semiconductor layers is denoted by $C_2$, an inequality represented by $0.1\leq C_2/C_1\leq 10$ is satisfied.

7. The semiconductor device according to claim 1, having a Fin structure.

8. The semiconductor device according to claim 1, having a nano-wire structure or a nano-sheet structure.

9. The semiconductor device according to claim 8, wherein the gate electrode is formed so as to extend from a top face of the channel portion to side faces of the channel portion, and further to a bottom face of the channel portion.

10. A manufacturing method for a semiconductor device, the semiconductor device including:
a channel portion,
a gate electrode disposed opposite the channel portion via a gate insulating film, and
source/drain regions disposed at both edges of the channel portion,
the method comprising the steps of:
subsequent to forming the channel portion, forming the gate electrode disposed opposite the channel portion via the gate insulating film;
subsequently, partially removing regions of a base body in which the source/drain regions are to be formed, in a thickness direction, to obtain source/drain region formation planned regions;
subsequently, forming, in the source/drain region formation planned regions, impurity layers having a second conductivity type; and
subsequently, forming, on the impurity layers, the source/drain regions including semiconductor layers having a first conductivity type different from the second conductivity type,
wherein a width of the channel portion is equal to a width of each of the source/drain regions.

11. The manufacturing method for the semiconductor device, according to claim 10,
wherein the channel portion includes a partial region of the base body, and
wherein partial removal of the regions of the base body in which the source/drain regions are to be formed is performed in the thickness direction, such that a cross-sectional shape of each side face of the channel portion has a concave shape with respect to each side face of the semiconductor layer that is opposite to each side face of the channel portion.

12. The manufacturing method for the semiconductor device, according to claim 10,
wherein the channel portion includes a partial region of the base body, and
wherein subsequent to the partial removal of the regions of the base body in which the source/drain regions are to be formed, in the thickness direction, offset spacers are formed on the obtained source/drain region formation planned regions and side faces of the channel portion to form the impurity layers via the offset spacers, and subsequently the offset spacers are removed.

13. The manufacturing method for the semiconductor device, according to claim 10, wherein the formation of the semiconductor layers on the impurity layers is based on an epitaxial growth method.

14. The manufacturing method for the semiconductor device, according to claim 10, wherein the impurity layers are formed in the source/drain region formation planned regions on a basis of an ion implantation method.

15. A semiconductor device, comprising:
a channel portion;
a gate electrode disposed opposite the channel portion via a gate insulating film; and
source/drain regions disposed at both edges of the channel portion,
wherein the source/drain regions include semiconductor layers that have a first conductivity type and that are formed inside recessed portions disposed on a base body,
wherein impurity layers having a second conductivity type different from the first conductivity type are formed between the base body and bottom portions of the semiconductor layers,
wherein the gate insulating film is provided below a top portion of the source/drain regions, and
wherein a width of the channel portion is equal to a width of each of the source/drain regions.

16. The semiconductor device according to claim 15,
wherein the channel portion includes a partial region of the base body, and
wherein a cross-sectional shape of each side face of the channel portion has a concave shape with respect to each side face of the semiconductor layers that is opposite to each side face of the channel portion.

17. The semiconductor device according to claim 15,
wherein the channel portion includes a partial region of the base body, and
wherein no impurity layer is formed between the partial region of the base body that constitutes the channel portion and the semiconductor layer.

18. The semiconductor device according to claim 15,
wherein the channel portion includes a partial region of the base body,
wherein second impurity layers are formed between the partial region of the base body that constitutes the channel portion and the semiconductor layer, and
wherein when an average thickness of the impurity layers is denoted by $T_1$ and an average thickness of the second impurity layers is denoted by $T_2$, an inequality represented by $0<T_2/T_1\leq 0.5$ is satisfied.

19. The semiconductor device according to claim 15, wherein an impurity concentration $C_1$ of the impurity layers is higher than an impurity concentration $C_2$ of the semiconductor layers.

20. The semiconductor device according to claim 15, wherein, when an impurity concentration of the impurity layer is denoted by $C_1$ and an impurity concentration of the semiconductor layers is denoted by $C_2$, an inequality represented by $0.1 \leq C_2/C_1 \leq 10$ is satisfied.

* * * * *